United States Patent [19]

Richards et al.

[11] Patent Number: 5,441,898
[45] Date of Patent: Aug. 15, 1995

[54] FABRICATING A SEMICONDUCTOR WITH AN INSULATIVE COATING

[75] Inventors: John G. Richards; Hector Flores, both of San Jose; Wendell B. Sander, Los Gatos, all of Calif.

[73] Assignee: Micro Technology Partners, San Jose, Calif.

[21] Appl. No.: 363,732

[22] Filed: Dec. 29, 1994

Related U.S. Application Data

[62] Division of Ser. No. 889,832, May 27, 1992, Pat. No. 5,403,729.

[51] Int. Cl.⁶ .................................. H01L 29/00
[52] U.S. Cl. ............................ 437/15; 437/51; 437/904; 437/974; 437/67; 148/DIG. 135
[58] Field of Search .................. 437/15, 228, 175, 177, 437/178, 180, 182, 203, 204, 51, 974, 904, 67; 148/DIG. 135

[56] References Cited

U.S. PATENT DOCUMENTS

| | | |
|---|---|---|
| 3,200,311 | 8/1965 | Thomas et al. |
| 3,462,655 | 8/1969 | Coblenz |
| 3,559,282 | 2/1971 | Lesk |
| 3,566,214 | 2/1971 | Usuda |
| 3,594,619 | 7/1971 | Kamoshida |
| 3,602,982 | 9/1971 | Kooi |
| 3,666,588 | 5/1972 | Wanesky |
| 3,680,205 | 8/1972 | Kravitz |
| 3,686,748 | 8/1972 | Engeler et al. |
| 3,746,945 | 7/1973 | Normington |
| 3,748,546 | 7/1973 | Allison |
| 3,754,169 | 8/1973 | Lyon et al. |
| 3,761,782 | 9/1973 | Youmans |
| 3,808,470 | 4/1974 | Kniepkamp |
| 3,820,235 | 6/1974 | Goldman |
| 3,886,578 | 5/1975 | Eastwood et al. |
| 3,905,094 | 9/1975 | Ruggiero |
| 3,944,447 | 3/1976 | Magdo et al. |
| 4,063,176 | 12/1977 | Milligan et al. |
| 4,250,520 | 2/1981 | Denlinger |
| 4,278,985 | 7/1981 | Stobbs |
| 4,577,213 | 3/1986 | Bauhahn |
| 4,733,290 | 3/1988 | Reardon et al. |
| 4,738,933 | 4/1988 | Richards |

(List continued on next page.)

FOREIGN PATENT DOCUMENTS

| | | |
|---|---|---|
| 0029334 | 5/1981 | European Pat. Off. |
| 0057135 | 1/1982 | European Pat. Off. |

(List continued on next page.)

OTHER PUBLICATIONS

–Patent Cooperation Treaty Search Report for International Application No. PCT/US94/03408, 7 pages (Oct. 10, 1994).

(List continued on next page.)

*Primary Examiner*—Brian E. Hearn
*Assistant Examiner*—Tuan Nguyen
*Attorney, Agent, or Firm*—Blakely, Sokoloff, Taylor & Zafman

[57] ABSTRACT

An electrical apparatus having a top and a bottom is described. A right side portion comprised of a first substrate of semiconductor material is provided. A left side portion of a second substrate of semiconductor material comprising an integrated circuit is provided. A middle portion between the right side portion and the left side portion is provided. The middle portion is comprised of an insulative coating. A metallic interconnecting structure is provided that electrically couples the first substrate of the right side portion to the integrated circuit of the left side portion. The metallic interconnecting structure extends over the insulative material of the middle portion. A top portion comprised of the insulative material is provided that covers the integrated circuit, the metallic interconnecting structure, the left side portion, the right side portion, and the middle portion. The top portion and the middle portion sandwich the metallic interconnecting structure. A substantially planar first metallic pad is provided for a first connection to external circuitry. The first metallic pad resides on the bottom of the right side portion. The first metallic pad provides a first polarity coupling to the integrated circuit. A method of fabricating the electrical apparatus is also described.

9 Claims, 14 Drawing Sheets

U.S. PATENT DOCUMENTS

| | | |
|---|---|---|
| 4,780,424 | 10/1988 | Holler et al. . |
| 4,811,080 | 3/1989 | Richards . |
| 4,855,796 | 8/1989 | Wong et al. . |
| 4,859,629 | 8/1989 | Reardon et al. . |
| 4,866,499 | 9/1989 | Aktik . |
| 4,905,071 | 2/1990 | Chalifour et al. . |
| 5,024,966 | 6/1991 | Dietrich et al. . |
| 5,034,801 | 7/1991 | Fischer . |
| 5,045,503 | 9/1991 | Kobiki et al. . |
| 5,102,822 | 4/1992 | Calligaro ............................. 437/67 |
| 5,117,280 | 5/1992 | Adachi . |
| 5,162,258 | 11/1992 | Lemnios et al. ...................... 437/51 |
| 5,198,385 | 3/1993 | Devitt et al. .......................... 437/51 |
| 5,280,194 | 1/1994 | Richards et al. . |

FOREIGN PATENT DOCUMENTS

| | | |
|---|---|---|
| 54-136176 | 10/1979 | Japan . |
| 56-148848 | 1/1981 | Japan . |
| 63-288062 | 1/1988 | Japan . |
| 63-47972 | 2/1988 | Japan . |
| 2067354 | 7/1981 | United Kingdom . |
| 9005997 | 5/1990 | WIPO . |
| 9015438 | 12/1990 | WIPO . |

OTHER PUBLICATIONS

–W. A. Gambling, "Microwave Semiconductor Devices," Electronic Engineering Series, pp. 105–108 (1972).

–W. J. Garceau et al., "Modified Beam Lead Magnetics for Handling Semiconductors," Western Electric Technical Digest, No. 51, pp. 11–12 (Jul. 1978).

–Thomas S. Laverghetta, *Solid–State Microwave Devices*, pp. 1–117, 178–188 (Artech House, Inc. 1987).

–Joseph F. White, Ph.D., *Microwave Semiconductor Engineering*, pp. vii–xvii, 39–112, and 364–369 (Van Nostrand Reinhold Company, Inc. 1982).

–Metalics Advertisement, p. 262 of *Microwaves & RF*, vol. 27, No. 5 (May 1988).

–M–Pulse Microwave Advertisement, pp. 8–9 of *Microwaves & RF*, vol. 27, No. 5 (May 1988).

–M–Pulse Microwave Brochure *Microwave Schottky Diodes*.

–M–Pulse Microwave Brochure *Zero Bias Schottky Diodes*.

–M–Pulse Microwave Brochure *Outline Dimensions*.

–M–Pulse Microwave Brochure *PIN Diodes*.

–M–Pulse Microwave Brochure *Hybrid Schottky Barrier Diodes*.

–M–Pulse Microwave Brochure *Step Recovery Diodes*.

–M–Pulse Microwave Brochure *Microwave Tunnel Diodes*.

–M–Pulse Microwave Brochure *MNOS Chip Capacitors*.

–M–Pulse Microwave Brochure *Techniques for Hybrid Assembly* (Application Note 220).

–6 sheets of drawings by Alpha Industries, Inc. that refer to "Date Feb. 12, 1990".

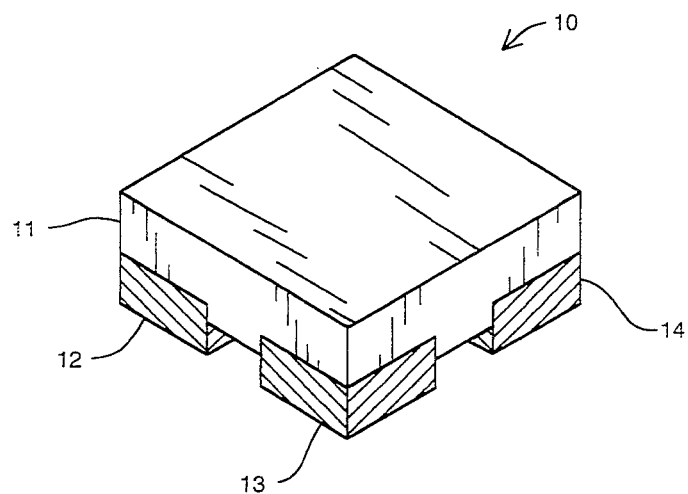
FIG_1
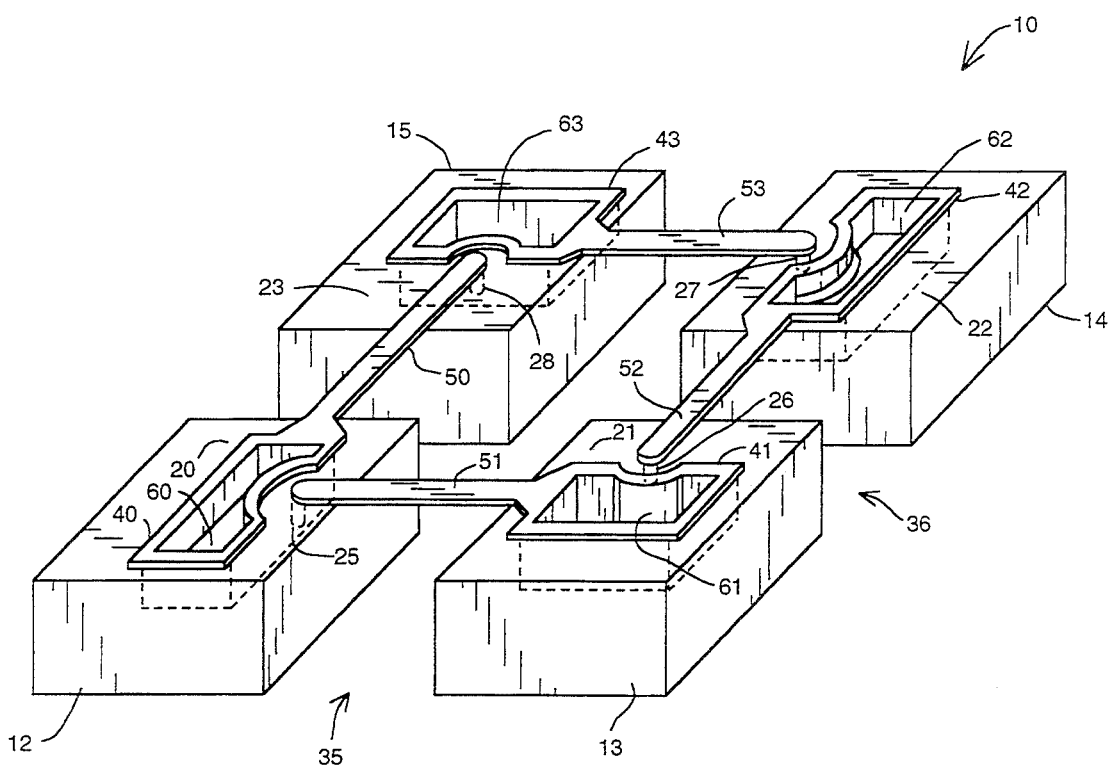
FIG_2

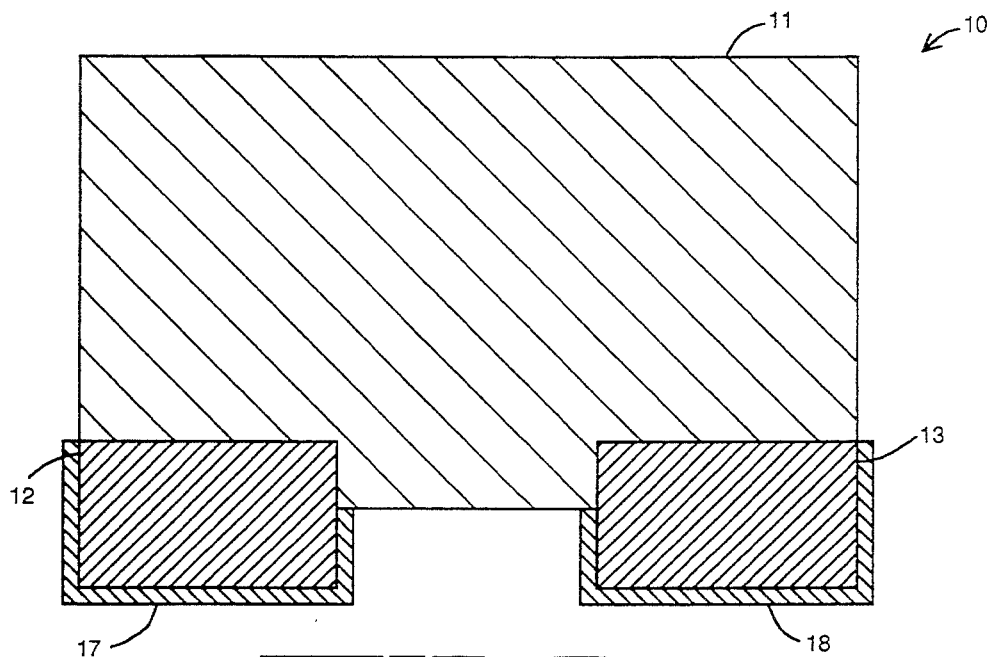
FIG_3
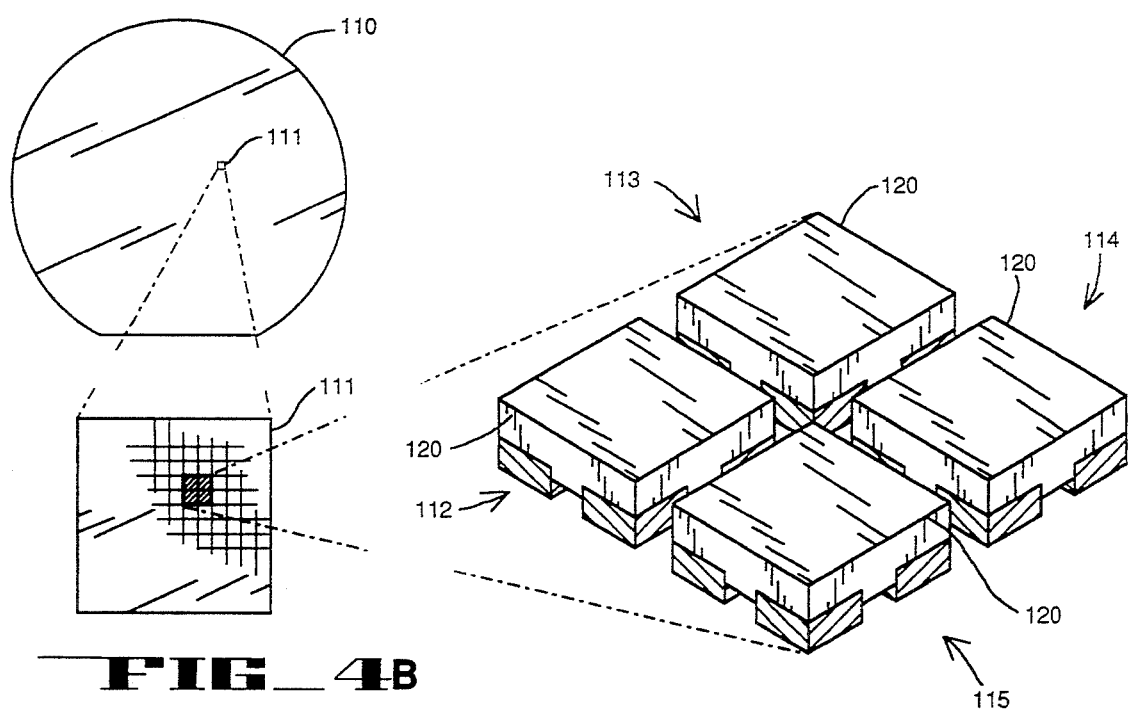
FIG_4A
FIG_4B
FIG_4C

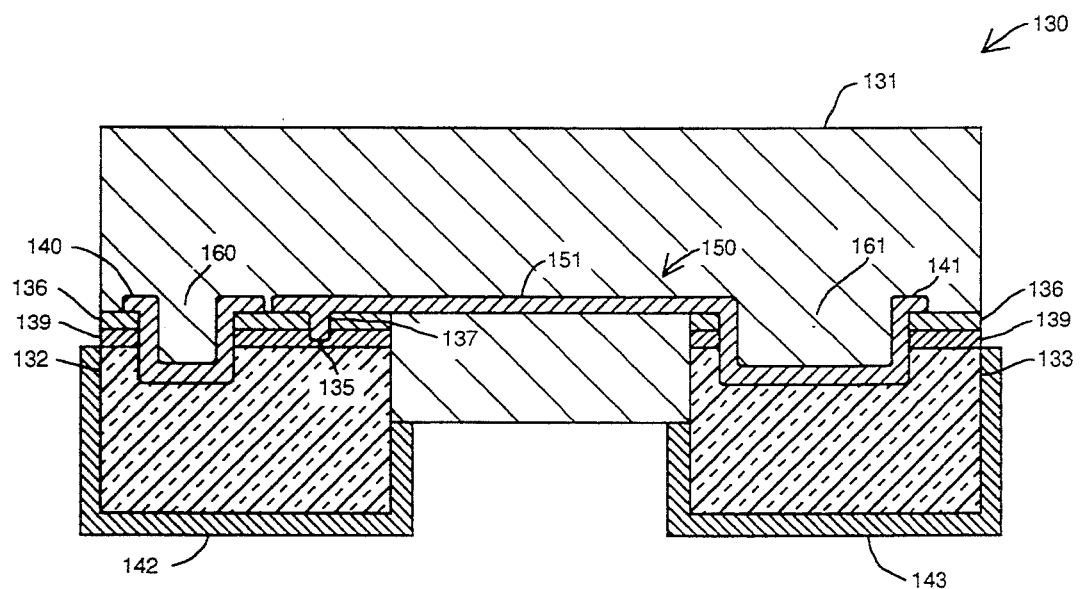
FIG_5
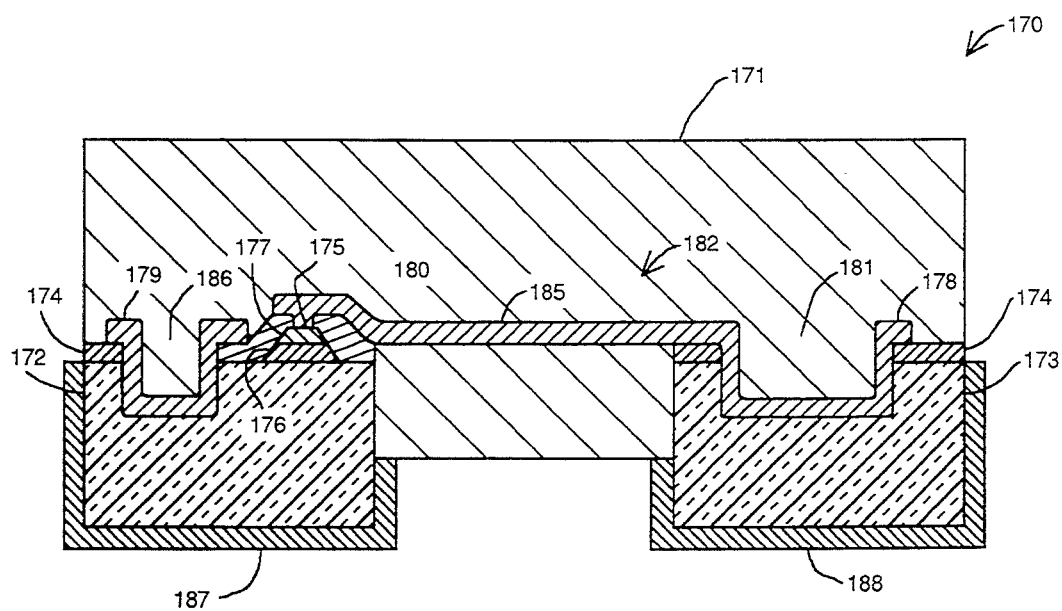
FIG_6

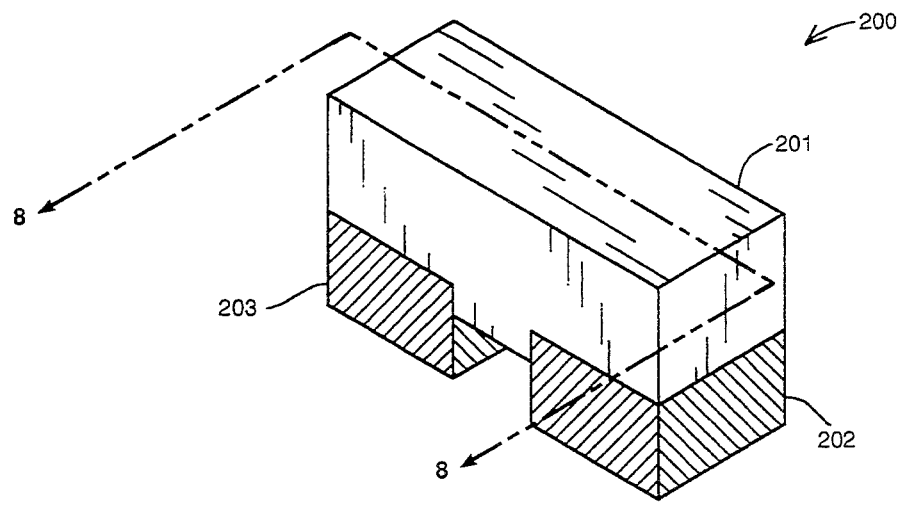
FIG_7
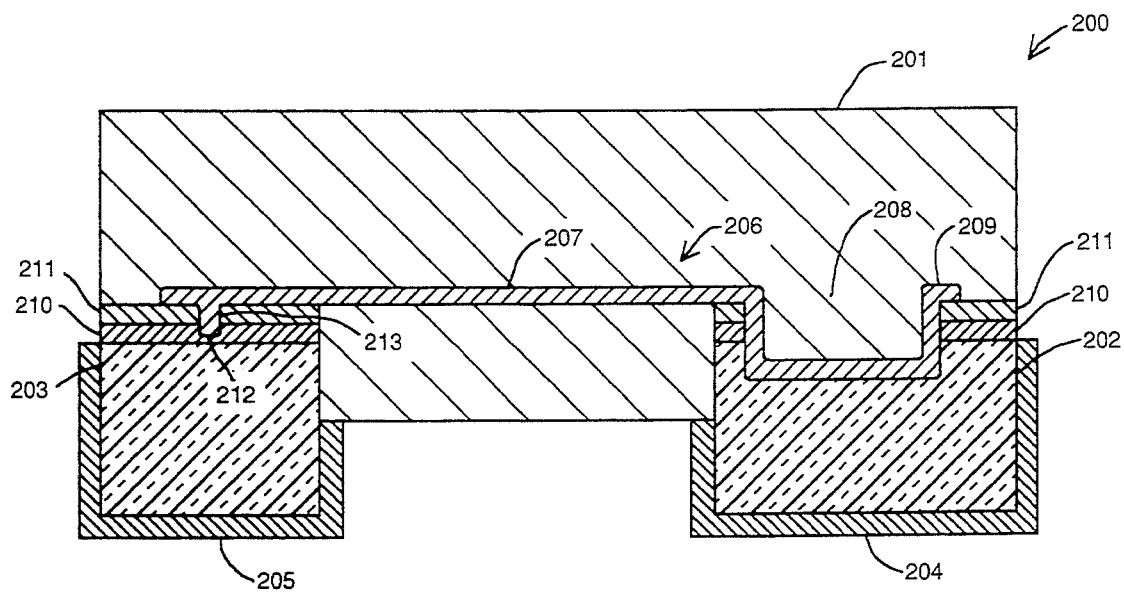
FIG_8

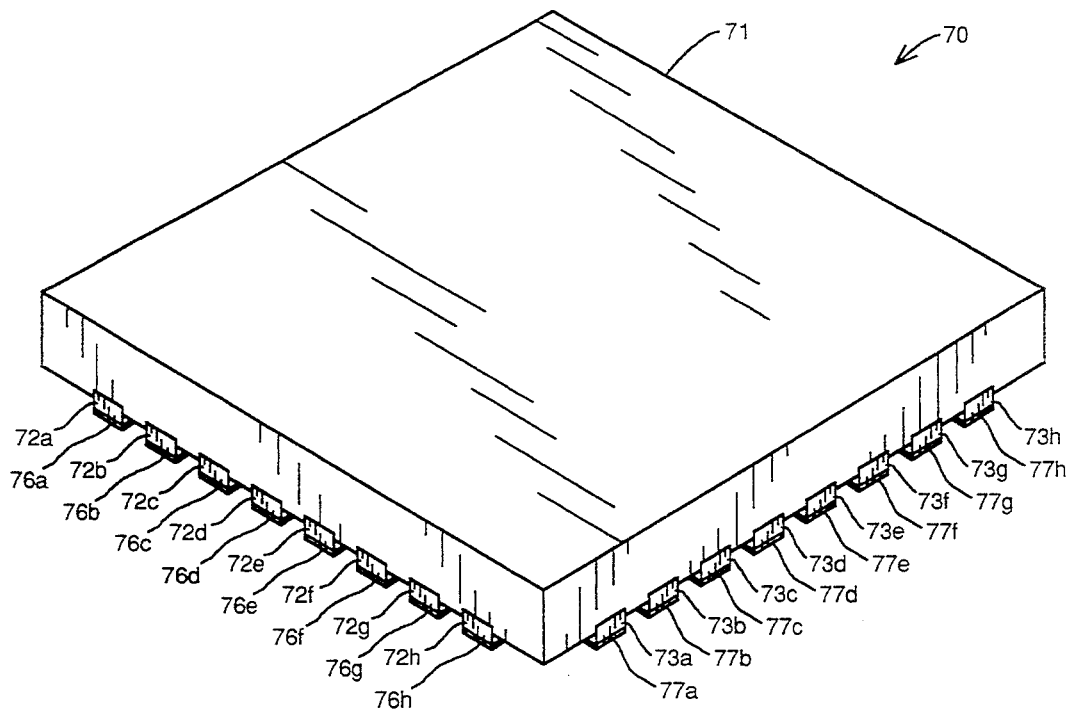
FIG_9
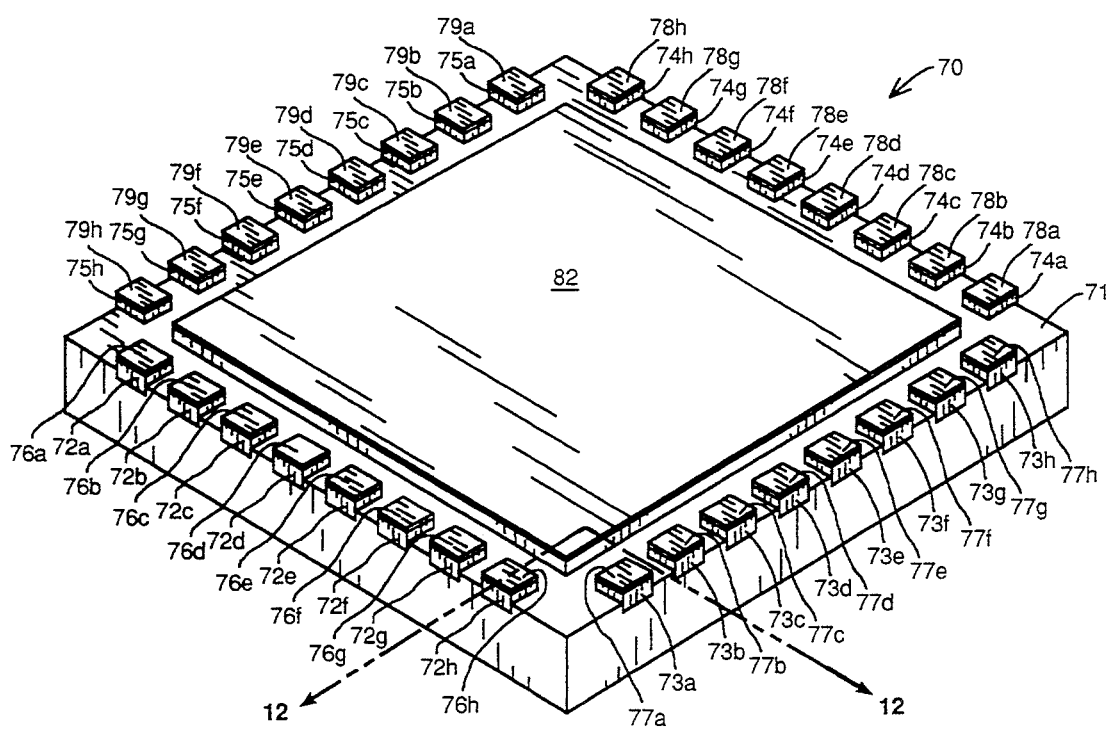
FIG_10

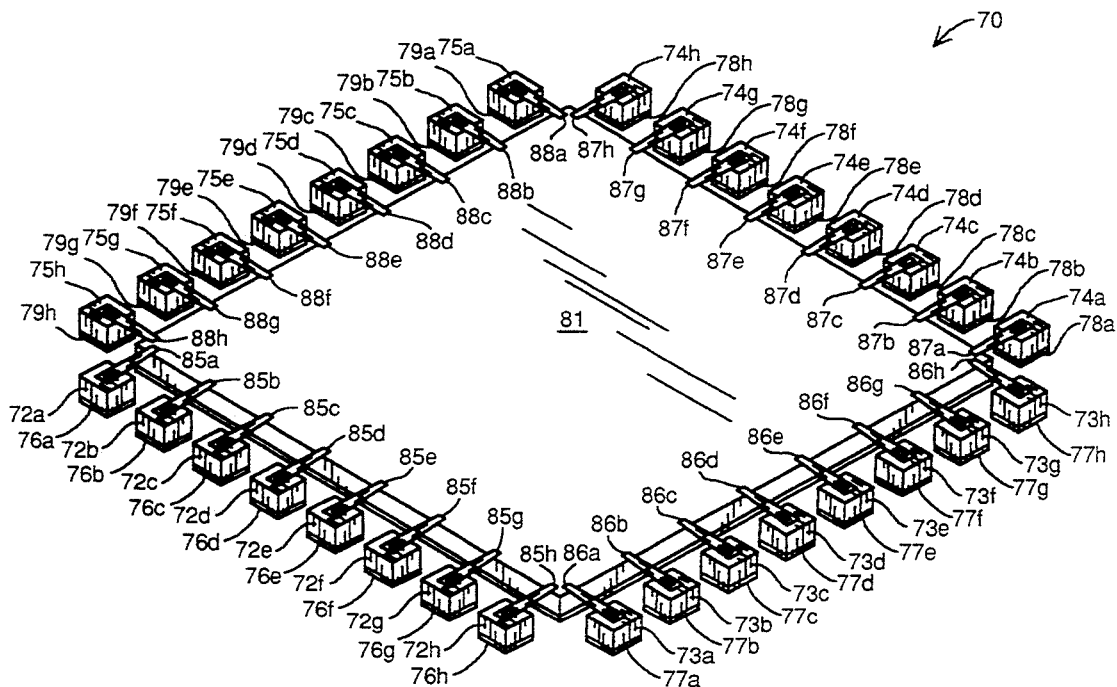
FIG_11
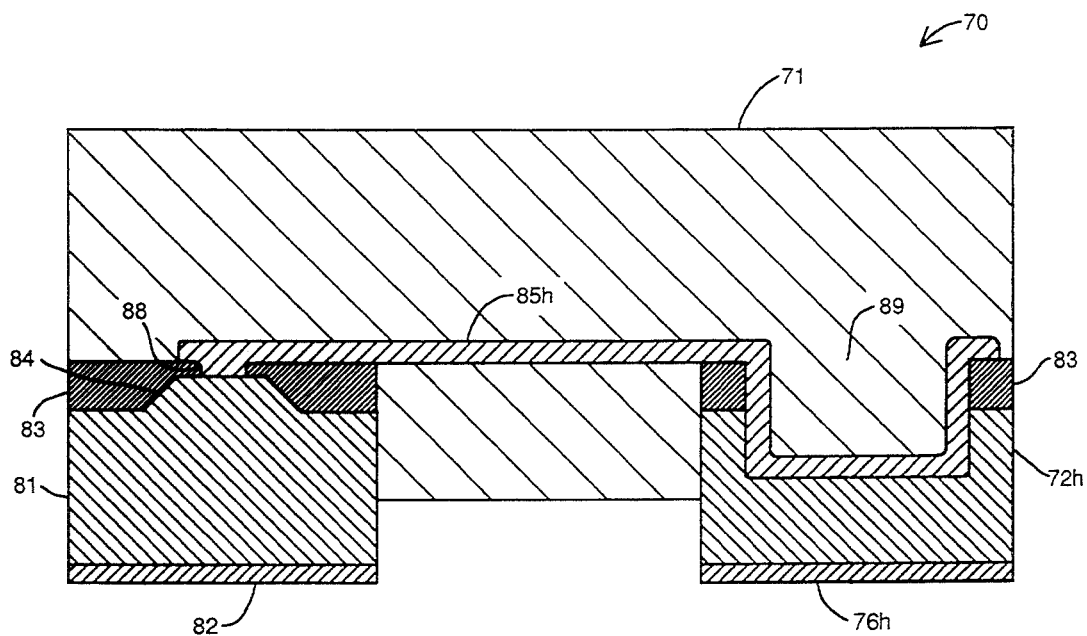
FIG_12

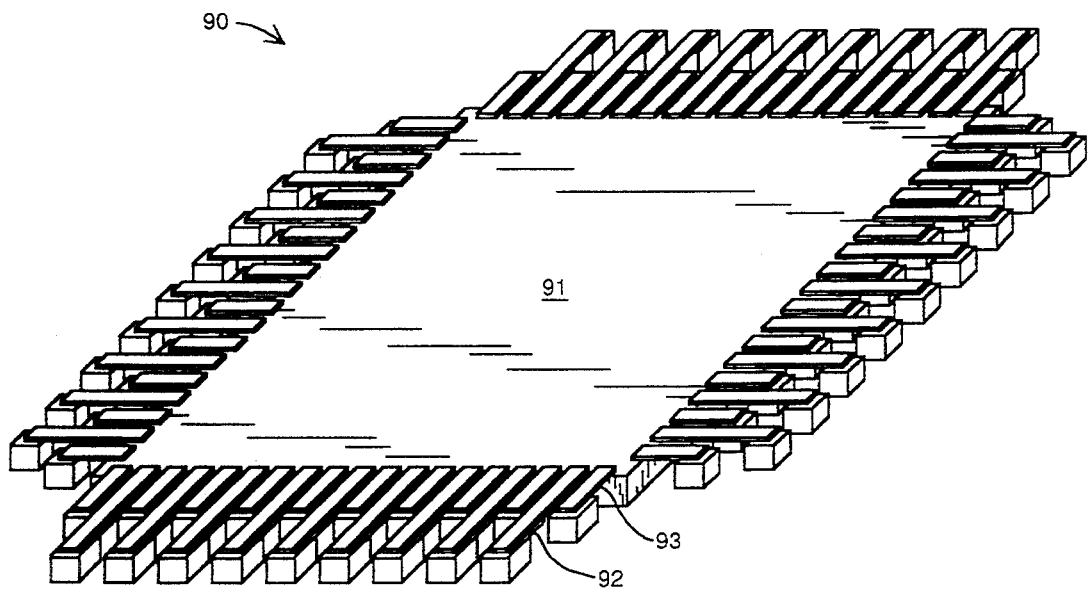
FIG_13
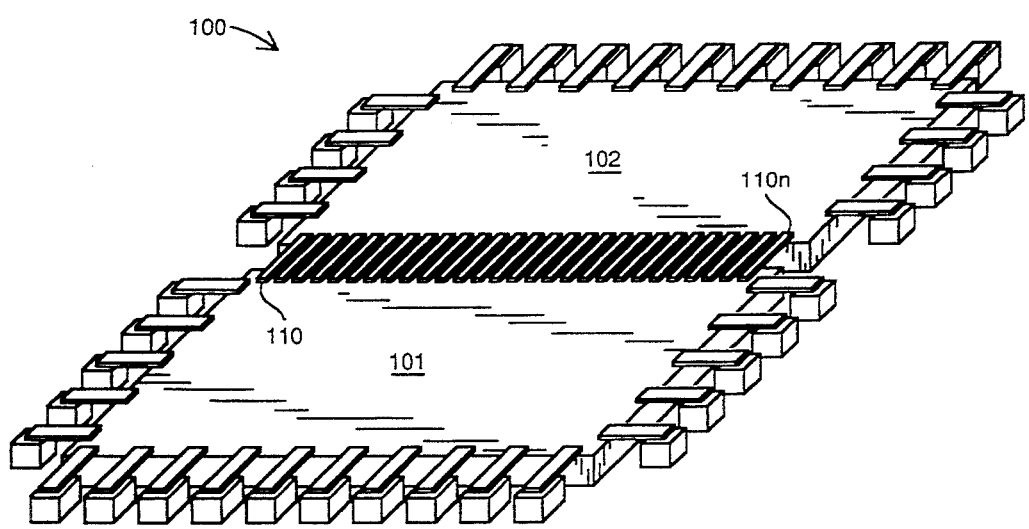
FIG_14

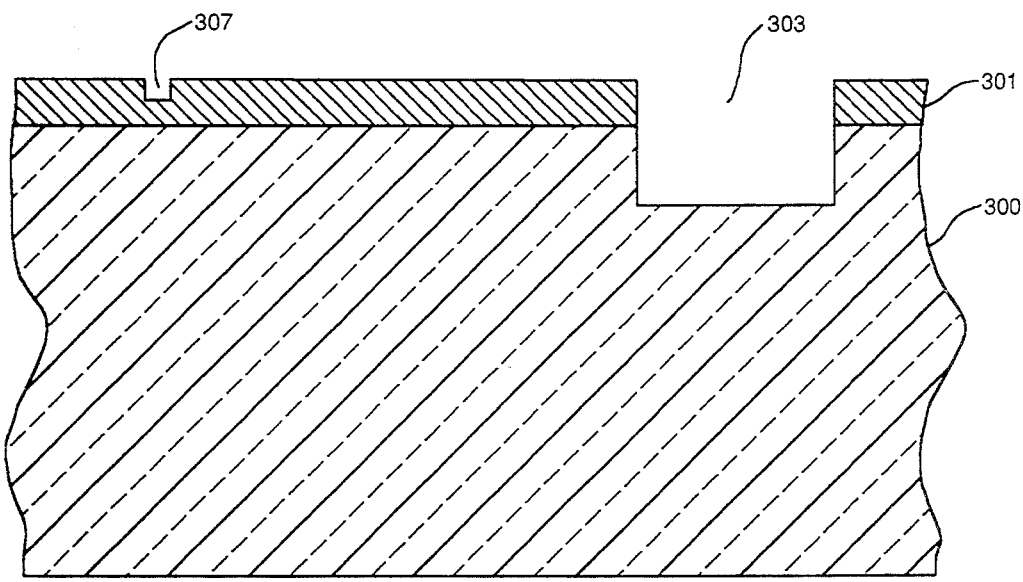
FIG_15
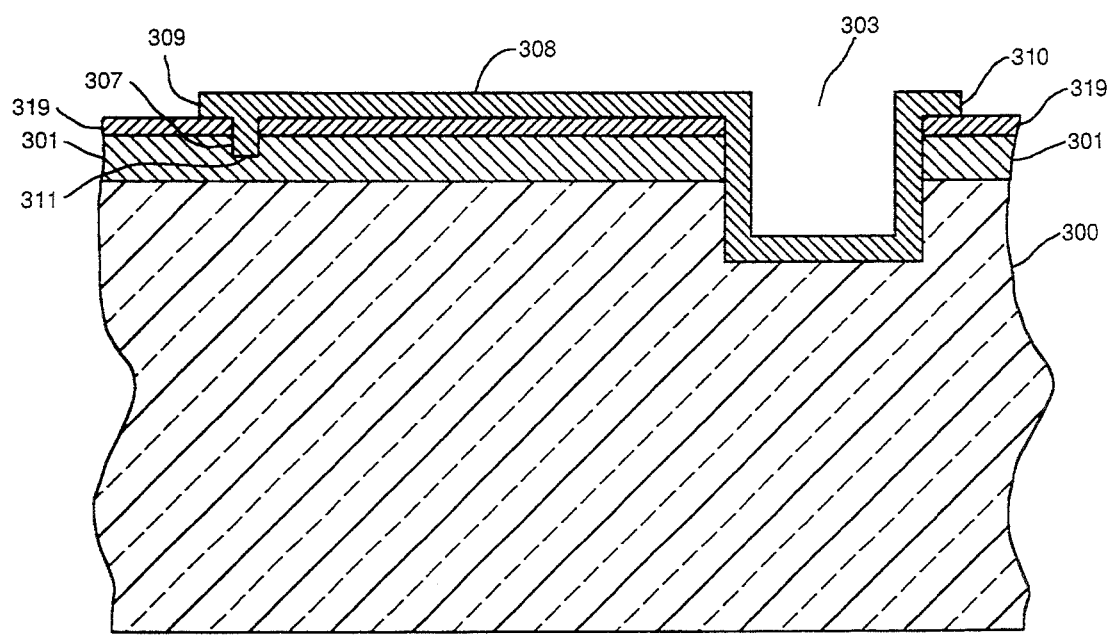
FIG_16

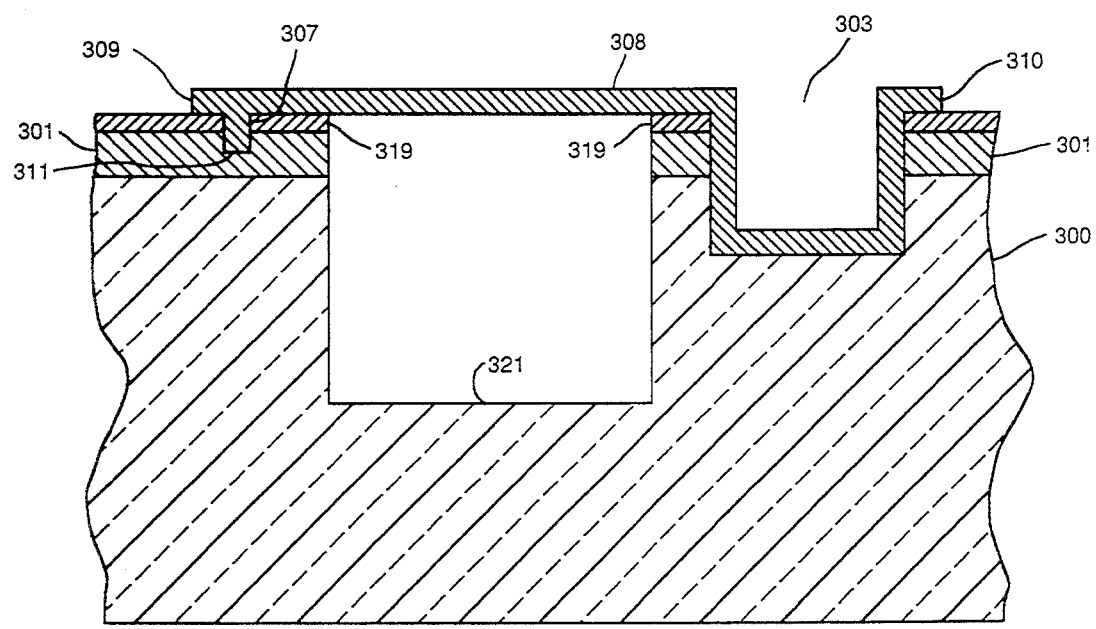
FIG_17
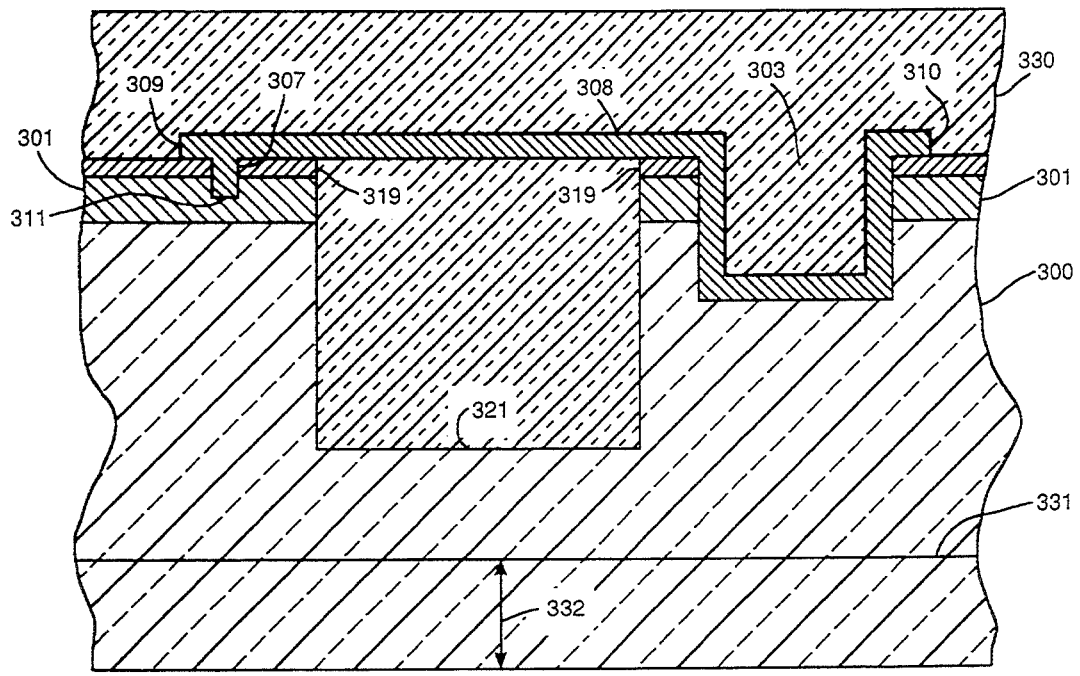
FIG_18

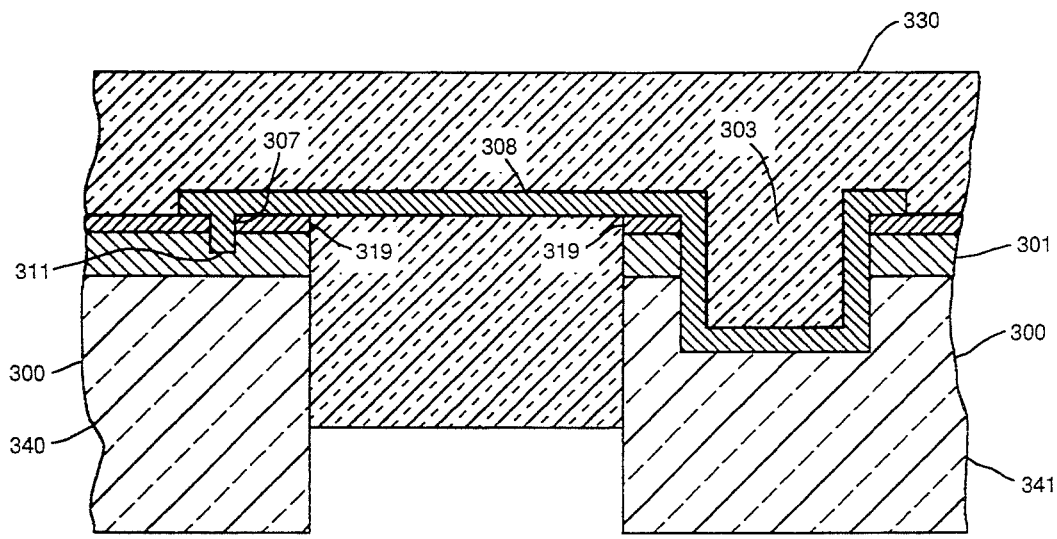
FIG_19
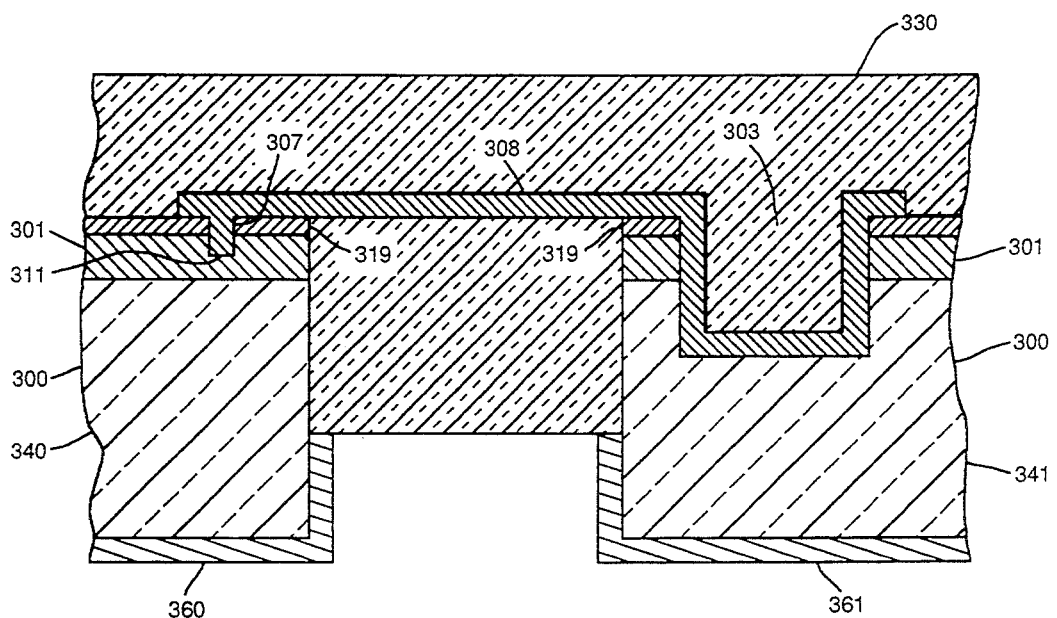
FIG_20

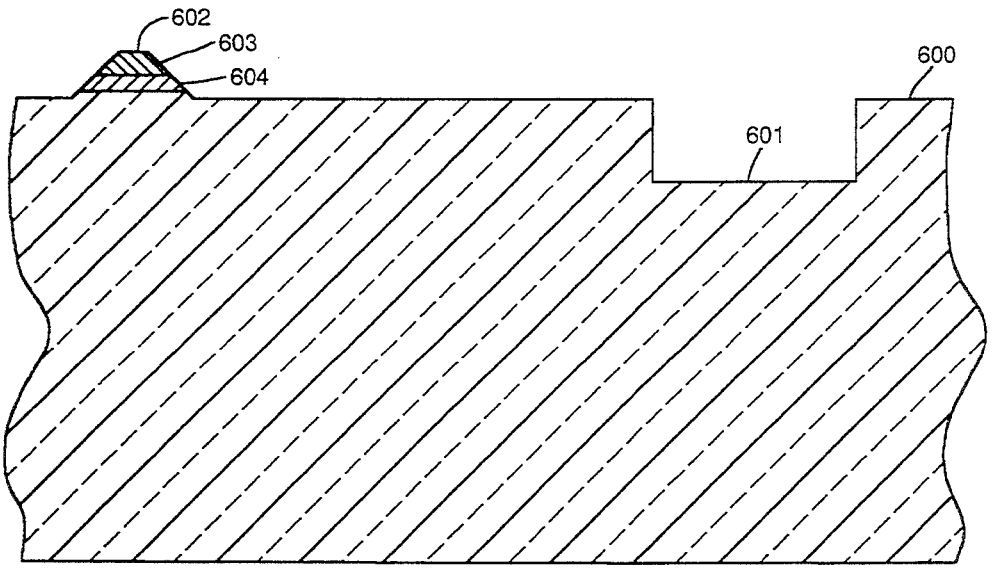
FIG_21
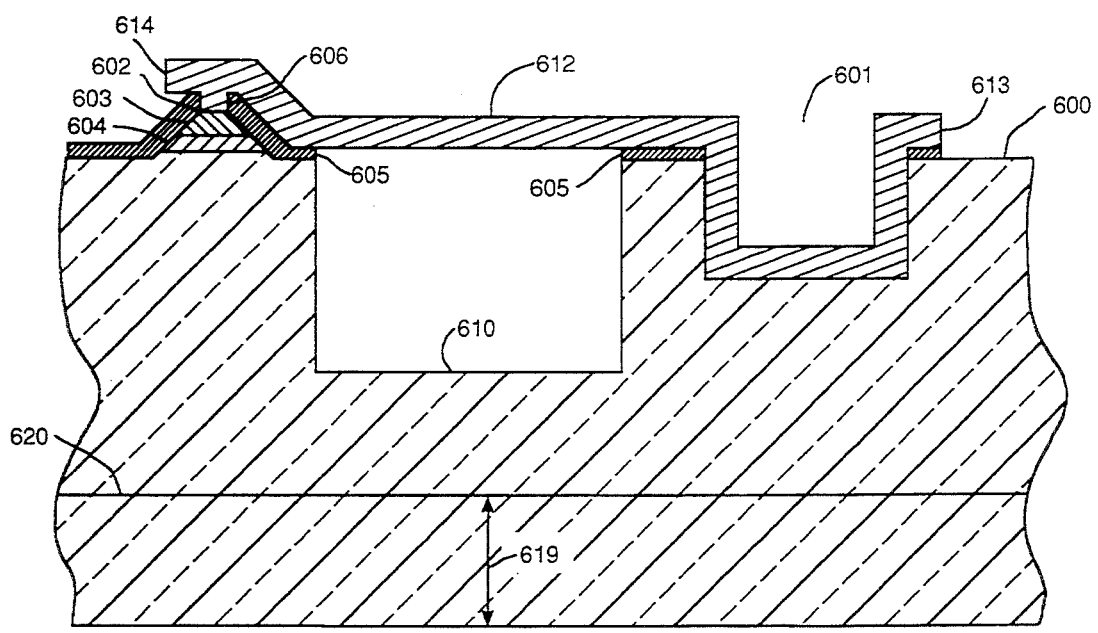
FIG_22

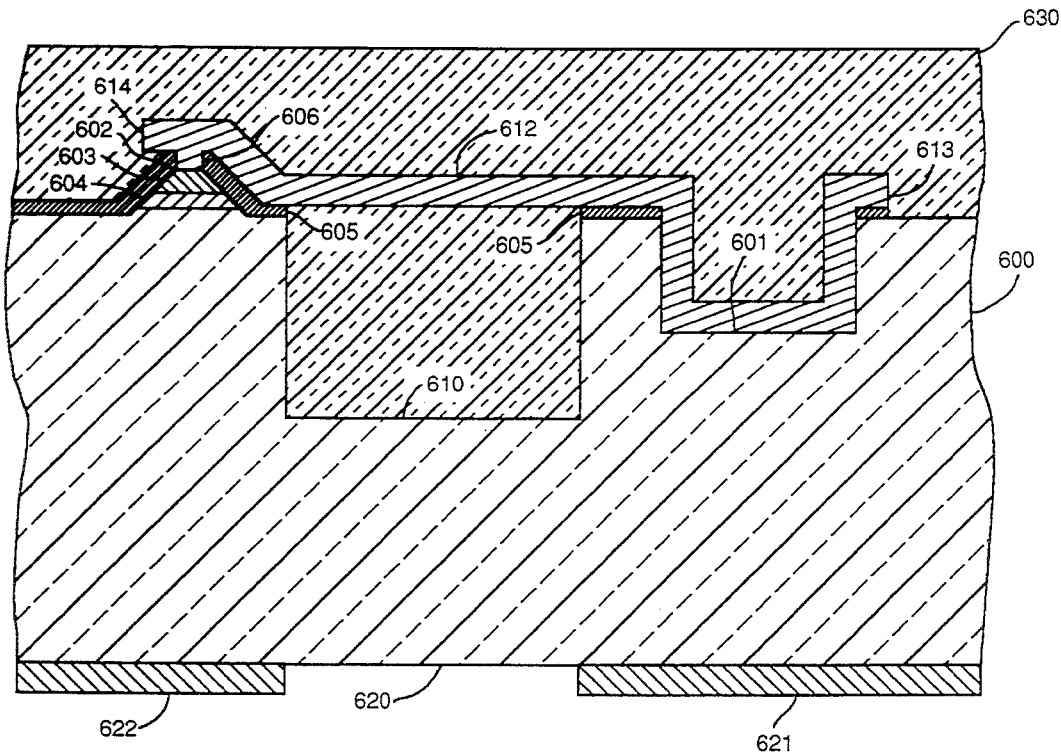
FIG_23
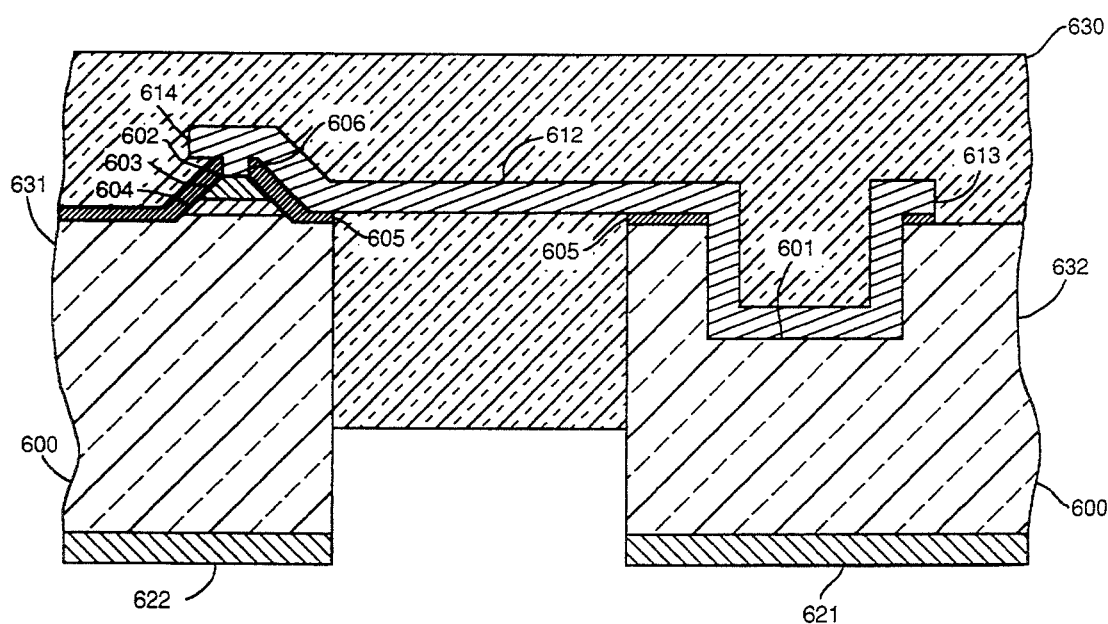
FIG_24

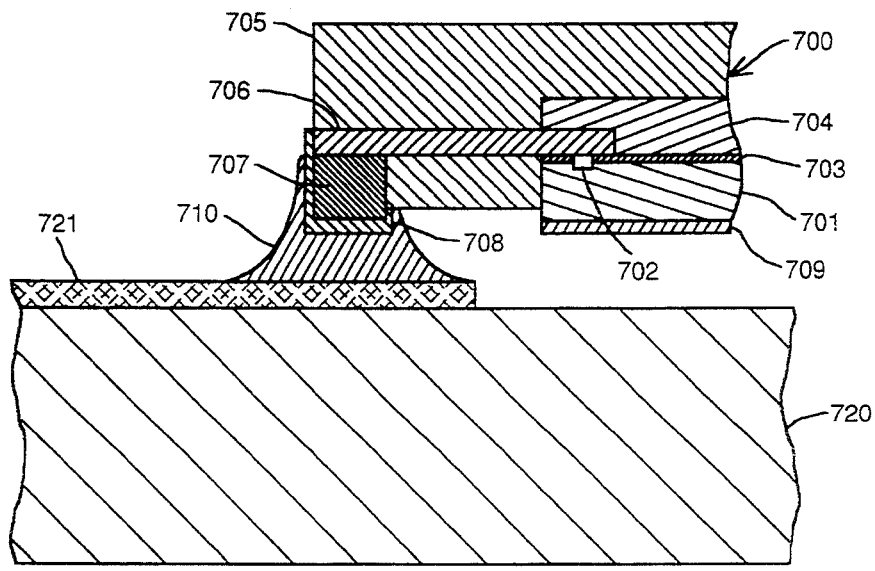
FIG_25
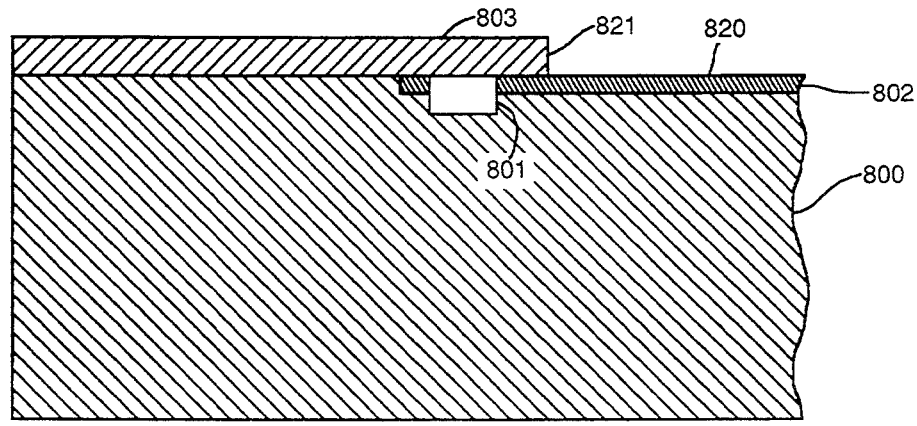
FIG_26
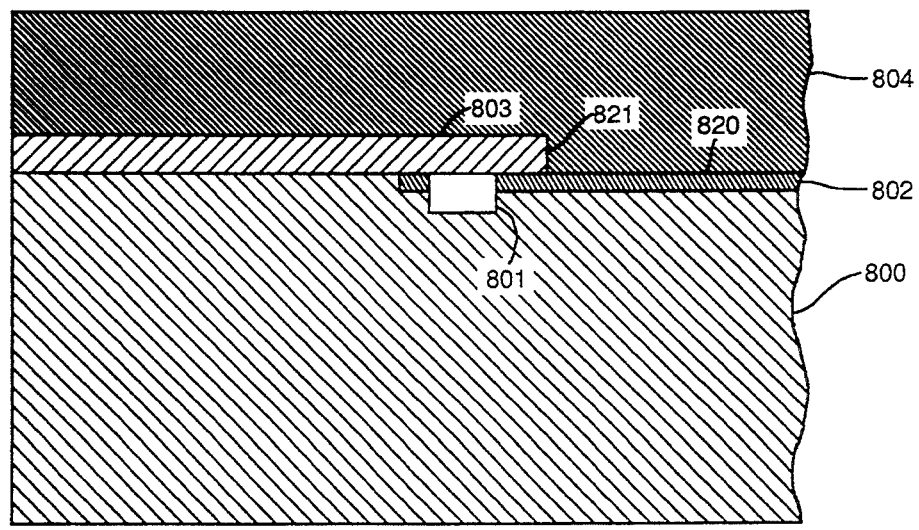
FIG_27

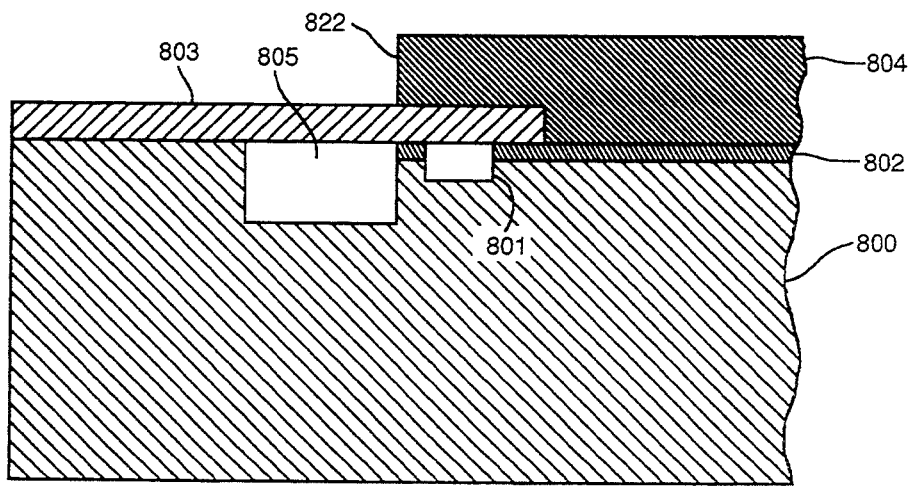
FIG_28
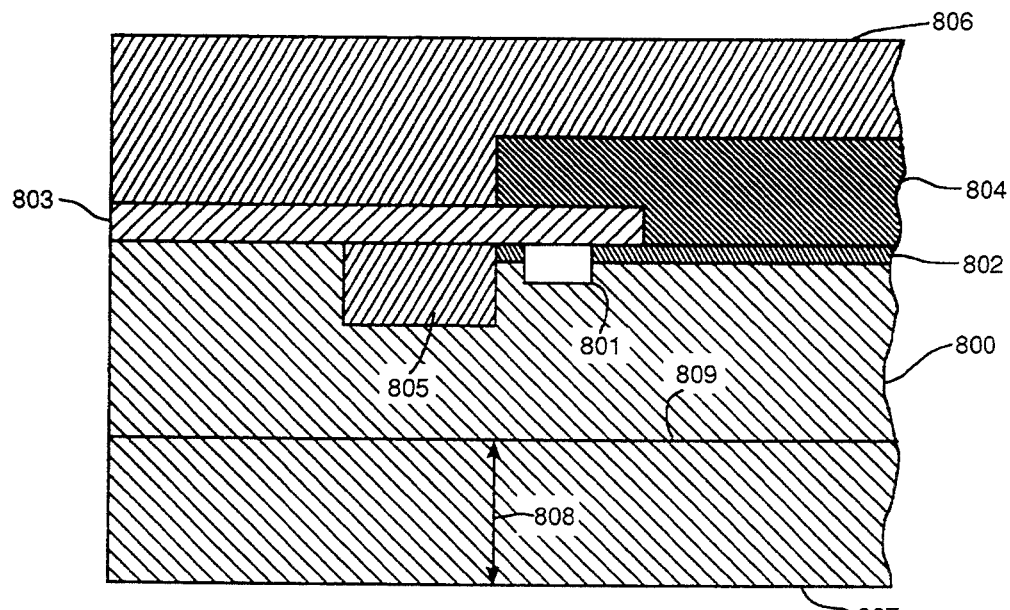
FIG_29
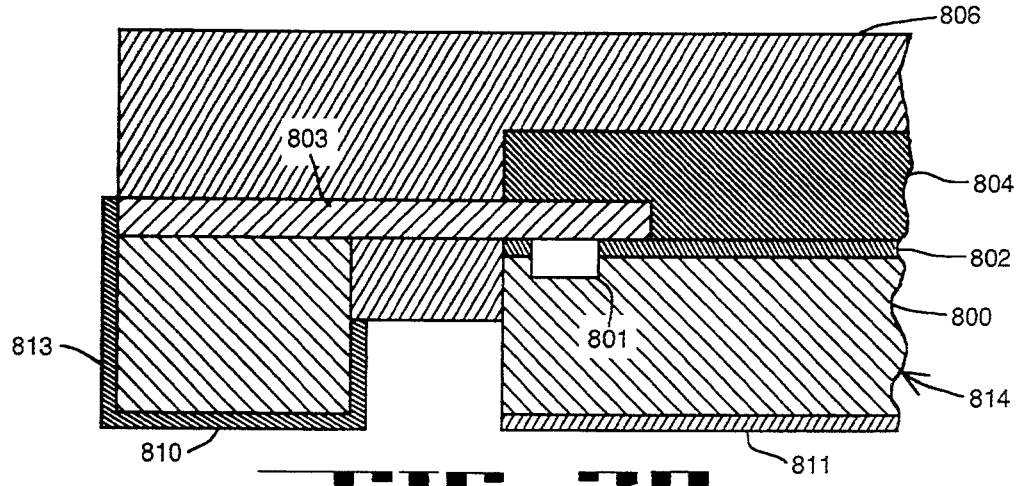
FIG_30

FABRICATING A SEMICONDUCTOR WITH AN INSULATIVE COATING

This is a divisional of application Ser. No. 07/889,832, filed May. 27, 1992, now U.S. Pat. No. 5,403,729.

FIELD OF THE INVENTION

The present invention pertains to the field of electrical devices. More particularly, this invention relates to a semiconductor with an insulative coating. The present invention also relates to a method of making the semiconductor with the insulative coating.

BACKGROUND OF THE INVENTION

Prior microwave electrical devices include resistors, series shunt elements, and solid-state devices such as Schottky diodes, PIN diodes, varactor diodes, and transistors. Another prior microwave device is a bridge quad (also referred to as a sampling bridge) that includes four diodes in one package. Another prior microwave electrical device that has four diodes is a ring quad, also called a quad-ring.

One type of prior microwave device has beam leads on the top of the device to provide connections to external circuitry. The beam leads are structurally supported by diodes that make up the device. The beam leads also provide interconnections between terminals of the diodes. For example, on certain prior ring quads, the beam leads provide interconnections between the anodes and cathodes of the respective diodes.

For another type of prior microwave electrical device, metal interconnections reside on one side of the device and metalized layers for external connections reside on the other side of the device. This helps to make the device less fragile. Prior microwave devices using this alternative configuration include ring quads, bridge quads, and diodes.

Both of the prior types of microwave devices discussed above typically use glass to hold components of the devices together. For example, certain prior ring quads typically use glass to hold four diode blocks together. Metallic interconnections for those prior microwave devices typically provide only minimal support. Thus, for certain types of prior microwave devices, glass is the material that provides major structural support.

Nevertheless, the structural support provided by the glass typically is only for a portion of a prior device assembly process. During the final stages of device fabrication, prior microwave devices are typically either (1) completely encased in glass to form a hermetic seal or (2) encapsulated in epoxy.

The way glass is used for certain prior microwave devices has several disadvantages. One disadvantage is that the glass makes the prior microwave devices relatively fragile. Because of this fragility, those prior microwave devices have relatively low maximum tear strengths. This means that certain prior microwave devices can be destroyed relatively easily.

Another disadvantage associated with certain prior microwave devices is that assembly operations are relatively tedious and delicate given that beam leads of certain prior microwave devices are not covered by the glass layer. Capacitance, inductance, and balance problems can arise from improper bonding of the beam leads. The exposed and relatively large beam leads during the fabrication process are also prone to bending, which can result in capacitance, inductance, and balance problems. Dynamic resistance problems can also arise. Special care is typically required for the beam leads to seat properly during packaging.

Another disadvantage associated with glass is that air bubbles are typically formed inside the glass layer during fabrication. When the liquified glass is deposited during certain prior fabrication processes, air often enters the liquified glass and forms air bubbles inside the glass. The air bubbles inside the glass typically weaken the glass in a nonuniform way from point to point and from device to device. This results in differences in strength between prior microwave devices from device to device.

Another disadvantage with certain prior microwave devices is that glass typically is liquified as part of the fabrication process. This requires relatively high temperatures.

One type of prior integrated circuit is typically attached to a package substrate when being packaged to a lead package. The leads of the prior integrated circuit are typically bonded to respective leads of the lead package.

One disadvantage of such prior integrated circuit is that the leads of the prior integrated circuit tend to have relatively high lead inductance that typically results in electrical problems with respect to the circuit. Another disadvantage is that the packaging of the prior integrated circuit is typically relatively expensive. Another disadvantage is that the leads need to be spaced apart far enough to permit the use of wire bonding machinery.

Another type of prior integrated circuit employs beam leads formed on the top of the prior integrated circuit for attachment to a next level of interconnection. In addition, the beam leads provide connections to external circuitry. These beam leads, however, are typically relatively fragile and difficult to handle.

Another type of prior integrated circuit uses bumps on the die or substrate or both, or uses solder balls, to attach the chip directly to a substrate in a "flip chip" fashion. One disadvantage with these approaches is that there may be different thermal expansions with respect to the chip and the substrate, which in some cases can lead to failure of the solder connection. Moreover, such arrangements may result in the chip being easily damaged during handling.

SUMMARY AND OBJECTS OF THE INVENTION

One of the objects of the present invention is to provide an electrical apparatus that is relatively rugged.

Another object of the present invention is to simplify the fabrication of an electrical apparatus.

Another object of the present invention is to minimize the high temperatures used in the fabrication of an electrical apparatus.

Another object of the present invention is to provide an electrical apparatus that does not include air bubbles.

Another object of the present invention is to provide a fabrication process for an electrical apparatus, wherein the fabrication process does not have a secondary assembly step.

Another object of the present invention is to provide an electrical apparatus with a rigid insulative layer that increases the rigidity with respect to the electrical apparatus and a flexible insulative layer that permits thermal expansion within the electrical apparatus.

Another object of the present invention is to provide for final device testing while the devices reside on a wafer.

Another object of the present invention is to provide an electrical apparatus with metallic sidewalls to improve electrical bonding.

A method of fabricating an electrical apparatus is described. An integrated circuit is formed on a top of a substrate of a semiconductor material. The integrated circuit includes a top. The integrated circuit is covered with an insulating layer. An opening is formed through the insulating layer to the top of the integrated circuit. A metallic interconnecting structure is formed that electrically couples the top of the substrate to the top of the integrated circuit over the insulating layer. The metallic interconnecting structure contacts the top of the substrate at a contact point. A well is formed in the substrate between the integrated circuit and the contact point. The well resides below the metallic interconnecting structure. The insulating layer, the top of the substrate, the metallic interconnecting structure, and the well are covered with an insulative layer. The metallic interconnecting structure is sandwiched by the insulative layer. The semiconductor material residing below a bottom of the well is removed in order to form a first discrete region of the semiconductor material that includes the contact point and a second discrete region of the semiconductor material that includes the integrated circuit. A metal layer is applied to a bottom of the first region.

An electrical apparatus having a top and a bottom is described. A right side portion comprised of a first substrate of semiconductor material is provided. A left side portion of a second substrate of semiconductor material comprising an integrated circuit is provided. A middle portion between the right side portion and the left side portion is provided. The middle portion is comprised of an insulative material. A metallic interconnecting structure is provided that electrically couples the first substrate of the right side portion to the integrated circuit of the left side portion. The metallic interconnecting structure extends over the insulative material of the middle portion. A top portion comprised of the insulative material is provided that covers the integrated circuit, the metallic interconnecting structure, the left side portion, the right side portion, and the middle portion. The top portion and the middle portion sandwich the metallic interconnecting structure. A substantially planar first metallic pad is provided for a first connection to external circuitry. The first metallic pad resides on the bottom of the right side portion. The first metallic pad provides a first polarity coupling to the integrated circuit.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a perspective view of a ring quad;

FIG. 2 illustrates the structure of the ring quad of FIG. 1 without an epoxy layer on the top;

FIG. 3 is a side view of the ring quad of FIG. 1;

FIGS. 4A through 4C four ring quads cut from a wafer;

FIG. 5 is a cross-sectional side view of a Schottky-barrier diode ring quad;

FIG. 6 is a cross-sectional side view of a PIN diode ring quad;

FIG. 7 is a perspective view of a diode module;

FIG. 8 is a cross-sectional side view along line 8—8 of the diode module of FIG. 7;

FIG. 9 is a perspective view of a package for an integrated circuit, wherein the package includes an epoxy layer on the top;

FIG. 10 is another perspective view that shows the bottom of the integrated circuit package of FIG. 9;

FIG. 11 is another perspective view of the integrated circuit package of

FIG. 9 without the epoxy layer on the top;

FIG. 12 is a cross-sectional side view along line 12—12 of the integrated circuit package shown in FIG. 10;

FIG. 13 is a perspective view of another integrated circuit package;

FIG. 14 is a perspective view of yet another integrated circuit package;

FIG. 15 is a cross-sectional side view of the ring quad of FIG. 5 during one stage of fabrication;

FIG. 16 is a cross-sectional side view of the ring quad of FIG. 5 during another stage of fabrication;

FIG. 17 is a cross-sectional side view of the ring quad of FIG. 5 during another stage of fabrication;

FIG. 18 is a cross-sectional side view of the ring quad of FIG. 5 during another stage of fabrication;

FIG. 19 is a cross-sectional side view of the ring quad of FIG. 5 during yet another stage of fabrication;

FIG. 20 is a cross-sectional side view of the ring quad of FIG. 5 during a final stage of fabrication;

FIG. 21 is a cross-sectional side view of the ring quad of FIG. 6 during one stage of fabrication;

FIG. 22 is a cross-sectional side view of the ring quad of FIG. 6 during another stage of fabrication;

FIG. 23 is a cross-sectional side view of the ring quad of FIG. 6 during yet another stage of fabrication;

FIG. 24 is a cross-sectional side view of the ring quad of FIG. 6 during a final stage of fabrication;

FIG. 25 is a cross-sectional side view of a portion of an integrated circuit package being surface mounted on a circuit board;

FIG. 26 is a cross-sectional side view of the integrated circuit package FIG. 25 during one stage of fabrication;

FIG. 27 is a cross-sectional side view of the integrated circuit package of FIG. 25 during another stage of fabrication;

FIG. 28 is a cross-sectional side view of the integrated circuit package FIG. 25 during another stage of fabrication;

FIG. 29 is a cross-sectional side view of the integrated circuit package of FIG. 25 during yet another stage of fabrication;

FIG. 30 is a cross-sectional side view of the integrated circuit package of FIG. 25 during a final stage of fabrication.

DETAILED DESCRIPTION

FIGS. 1-3 illustrate a ring quad 10, which is one embodiment of the present invention. As can be seen from FIGS. 1-3, ring quad 10 includes four blocks 12 through 15, four metal interconnecting structures 20 through 23, and an epoxy layer 11. FIG. 1 is a perspective view of ring quad 10. FIG. 2 is a perspective view of ring quad 10 without epoxy layer 11. FIG. 3 is a side view of ring quad 10.

Epoxy layer 11 can be replaced with any other insulative layers. For example, epoxy layer 11 can be replaced with a plastic layer.

For one embodiment, epoxy layer 11 comprises a single insulative coating. For another embodiment, epoxy layer 11 comprises a rigid insulative layer plus a flexible insulating coating.

Referring to FIGS. 1–3, blocks 12–15 of ring quad 10 include diodes 25 through 28, respectively. Blocks 12–15 are therefore referred to as diode blocks of ring quad 10. Diode blocks 12–15 are separated by channels 35 and 36. Channel 35 intersects channel 36.

Metal interconnecting structures 20–23 include pan-like portions 40 through 43, respectively, and striplines 50 through 53, respectively. Striplines 50–53 each extends over one of channels 35 and 36, making connection from its respective pan-like portion in one diode block to its respective diode in another diode block. For example, stripline 50 extends over channel 36 to connect pan-like portion 40 in diode block 12 to diode 28 in diode block 15.

Each of metallic pan-like portions 40 through 43 resides within one of depressions or wells 60 through 63, respectively. Each of metallic pan-like portions 40–43 contacts the silicon substrate of its respective one of diode blocks 12–15.

Diodes 25–28 can be Schottky-barrier diodes. Diodes 25–28 can also be PIN or NIP diodes. In one preferred embodiment, diodes 25–28 are Schottky-barrier diodes. In another preferred embodiment, diodes 25–28 are PIN or NIP diodes.

Epoxy layer 11 is deposited on the top of ring quad 10, covering the top of diode blocks 12–15 and metal interconnecting structures 20–23. Epoxy layer 11 also extends into channels 35 and 36. Epoxy layer 11 is an insulative layer formed from insulative epoxy. In one embodiment, epoxy layer 11 is deposited using centrifugal force such that no air bubbles can be developed inside epoxy layer 11. As can be seen from FIGS. 1 and 3, epoxy layer 11 completely covers metal interconnecting structures 20–23 and the top of diode blocks 12–15.

Ring quad 10 also includes metal contact layers on the bottom of diode blocks 12–15. FIG. 3 illustrates metal contact layers 17 and 18 for diode blocks 12 and 13, respectively. The metal contact layers are flat and relatively large, which helps to ensure good contact with external circuitry.

In one preferred embodiment, Nichrome-gold is employed to form the metal contact layers. In another preferred embodiment, nickel-arsenic-gold is employed to form the metal contact layers. In alternative embodiments, palladium-silicide, nickel-arsenic, and nickel-gold can be used to form the metal contact layers.

As can be seen from FIG. 3, metal layers 17 and 18 both extend to the sidewalls of chips 12 and 13. This is to facilitate inspection during surface mount of ring quad 10. The fact that the solder has been sufficiently applied can be easily confirmed by seeing the solder on the side walls of ring quad 10. When solder reaches the metal layer on the sidewall of a device, it indicates that a good mount is made. Having solder applied on the side walls of chips 12 and 13 also helps to strengthen the bonding of ring quad 10 to external circuitry.

Testing of ring quad 10 can be done via metal layers on the bottoms of ring quad 10, such as metal layers 17 and 18. Testing of ring quad 10 can be done while ring quad 10 is on a wafer. A black wax is used to attach the top of epoxy layer 11 of ring quad 10 and tests are done through the bottom contact metal layers.

Ring quad 10 can be die-attached to external circuitry using solder or conductive epoxy.

Ring quad 10 is relatively strong and has a relatively high tear strength. This is due to the fact that epoxy layer 11 exhibits relatively strong adhesion and high toughness. Epoxy also has high corrosion resistance and high chemical resistance.

In addition, the use of an epoxy layer permits many different sizes of ring quads to be fabricated. Moreover, because of the strong adhesive nature of the epoxy material, channels 35 and 36 between any two of diode blocks 12–15 can be relatively small and thin. A small amount of epoxy material can be employed to separate and hold diode blocks 12–15.

Moreover, the use of epoxy permits a fabrication process that is streamlined and that results in a relatively high yield. Epoxy layer 11 can be deposited at room temperature in one step to separate diode blocks 12–15 of ring quad 10 and to encase ring quad 10. This allows ring quad 10 to be fully packaged on the wafer. One advantage of having packaged devices on the wafer is that they can be easily tested on the wafer and then sawed into individual devices.

Furthermore, air bubbles are avoided by using epoxy layer 11. Because the epoxy material is in liquid state at room temperature, the deposition can be performed using centrifugal force at room temperature and air bubbles in epoxy layer 11 are avoided during the deposition.

FIGS. 4A through 4C illustrate a manufactured wafer 110 being sawed into individual ring quads. FIG. 4C only illustrates four ring quads 112 through 115. Ring quads 112–115 each has the same structure as that of ring quad 10 of FIGS. 1–3. As can be seen from FIG. 4C, each of ring quads 112–15 is fully packaged with an epoxy layer 120 before being sawed. The ring quads can thus be tested while they are still on the wafer. Moreover, the epoxy layer on wafer 110 is relatively rugged. In addition, the epoxy layer is relatively easy to saw. Furthermore, no further major fabrication processing steps are required after wafer 110 is sawed. Ring quads 112–115 are simply packaged after wafer 110 is sawed.

FIG. 5 is a cross-sectional view of a ring quad 130. FIG. 5 illustrates the structure of ring quad 130 having Schottky-barrier diodes. Ring quad 130 represents ring quad 10 of FIGS. 1–3 when diodes 25–28 of ring quad 10 are Schottky-barrier diodes.

Referring to FIG. 5, a Schottky-barrier diode 135 is shown which lies at one end of a stripline 151 of a metal interconnecting structure 150. Diode 135 represents one of Schottky-barrier diodes in ring quad 130. Diode 135 is a Schottky-barrier metal. For one embodiment, the Schottky-barrier metal is titanium. For another embodiment, nickel is the Schottky-barrier metal.

For diode 135, a Schottky-barrier junction is formed between the Schottky-barrier metal and an N$^-$ silicon layer 139 on top of the silicon substrate of a first chip 132.

For one embodiment, interconnecting structure 150 is made of Schottky-barrier metal. For one embodiment, a layer of gold overlies Schottky-barrier metal of interconnecting structure 150. The layer of gold helps to inhibit oxidation of the Schottky-barrier metal.

As can be seen from FIG. 5, stripline 151 runs between diode 135 in first chip 132 and the N+ region of a second chip 133. Stripline 151 contacts diode 135 via an opening 137 through an insulating layer 136. Stripline 151 contacts the N+ region of second chip 133 by reaching down to the N+ region in a well or depression 161. This forms pan-like portion 141 of metal interconnecting structure 150. FIG. 5 shows another pan-like portion 140 in well 160 of first chip 132.

Epoxy layer 131 separates first chip 132 from second chip 133. Epoxy layer 131 also resides on top of metal interconnecting structure 150 and in wells 160 and 161. As can be seen from FIG. 5, stripline 151 is sandwiched by epoxy layer 131.

The bottom and side surfaces of first chip 132 are metalized to form contact metal layer 142. Contact metal layer 142 can be Nichrome-gold, for example. Contact metal layer 142 is flat on the bottom and relatively large, which helps to ensure good contact with external circuitry.

The bottom and side surfaces of second chip 133 are also metalized to form a contact metal layer 143. Contact metal layer 143 can be Nichrome-gold, for example. Contact metal layer 143 is flat on the bottom and relatively large, which helps to ensure good contact with external circuitry.

As can be seen from FIG. 5, Schottky-barrier diode 135 can have one end coupled to external circuitry via metal contact layer 142 and the other end coupled to external circuitry via metal interconnecting structure 150 and metal contact layer 143.

FIG. 6 is a cross-sectional view of a ring quad 170. FIG. 6 illustrates the structure of ring quad 170 having PIN diodes. Ring quad 170 represents ring quad 10 of FIGS. 1-3 when diodes 25-28 of ring quad 10 are PIN diodes.

Referring to FIG. 6, a first chip 172 includes a PIN diode 175. Diode 175 includes a region 176 of N− silicon which separates a P+ silicon 177 from the N+ substrate of first chip 172. The N− region 176 is also referred to as the intrinsic I region 176. First chip 172 thus comprises P+ region 177, N− region 176, and N+ substrate 172.

P+ region 177, N− region 176, and N+ region 172 form a mesa structure which constitutes PIN diode 175. A mesa is a plateau of semiconductor material with relatively steep sides. In an alternative embodiment, region 177 would be an N region, region 176 would be an intrinsic region, and region 172 would be a P region.

A stripline 185 of a metal interconnecting structure 182 contacts diode 175 via an opening 180 of an insulating layer 174. Stripline 185 contacts an N+ region of a second chip 173 by reaching down to the N+ region in a well or depression 181 of second chip 173. This forms pan-like portion 178 of interconnecting 182. FIG. 6 also shows another pan-like portion 179 in well 186 of first chip 172.

Epoxy layer 171 separates first chip 172 from second chip 173. Epoxy layer 171 also resides on top of metal interconnecting structure 182 and in wells 181 and 186. As can be seen from FIG. 6, stripline 185 of metal interconnecting structure 182 is sandwiched by epoxy layer 171.

In a preferred embodiment, first chip 172 is constructed within a single wafer of semiconductor material. Chips 172 and 173 are metalized on the bottom to form metal contact layers 187 and 188. Metal contact layers 187 and 188 also extend to side walls of chips 172 and 173, respectively. Contact metal layers 187 and 188 can be nickel-arsenic-gold, for example. Contact metal layers 187 and 188 are flat and relatively large, which helps to ensure good contact to external circuitry.

Metal interconnecting structure 182, in one preferred embodiment, is made of titanium. In a further embodiment, metal interconnecting structure 182 is coated with a layer of gold (not shown) to inhibit the oxidation of interconnecting structure 182.

As can be seen from FIG. 6, PIN diode 175 can have one end coupled to external circuitry via contact layer 187, and the other end coupled to external circuitry via interconnecting structure 182 and contact layer 188.

FIGS. 7 and 8 illustrate a diode module 200, which implements one embodiment of the present invention. FIG. 7 is a perspective view of diode module 200. FIG. 8 is a cross-sectional side view of diode module 200 along line 8—8 of FIG. 7.

Referring to FIG. 7, diode module 200 includes a first chip 202, a second chip 203, and an epoxy layer 201. Epoxy layer 201 covers a portion of first chip 202 and a portion of second chip 203 to form diode module 200. In one embodiment, diode module 200 includes a Schottky-barrier diode. In another embodiment, diode module 200 includes a PIN diode. In yet another embodiment, diode module 200 includes an NIP diode.

Referring to FIG. 8, chip 203 contains a diode 212. Diode 212 is a Schottky-barrier diode. Alternatively, diode 212 may be a PIN diode or an NIP diode.

A stripline 207 of an interconnecting structure 206 contacts diode 212 via an opening 213 of an insulating layer 211. Stripline 207 runs between first chip 202 and second chip 203. Stripline 207 contacts chip 202 in well 208 to form pan-like portion 209 of metal interconnecting structure 206.

Epoxy layer 201 separates first chip 202 from second chip 203. Epoxy layer 201 also resides on top of metal interconnecting structure 206 and in well 208. As can be seen from FIG. 8, stripline 207 is sandwiched by epoxy layer 201.

Epoxy layer 201 can be replaced with any other insulative layers. For example, epoxy layer 201 can be replaced with a plastic layer.

For one embodiment, epoxy layer 201 comprises a single insulative layer. For another embodiment, epoxy layer 201 comprises a rigid insulative layer and a flexible insulative coating.

Chips 202 and 203 include metal contact layers 204 and 205, respectively. Metal contact layers 204 and 205 each resides on the bottom of its respective chip. Each of contact layers 204 and 205 is flat and relatively large, which helps to ensure good contact with circuitry external to diode module 200. Contact layers 204 and 205 each can also extend to the side surfaces of its respective chip. This facilitates inspection during surface mount of diode module 200. The fact that the solder has been sufficiently applied can be easily confirmed by seeing the solder on the side walls of diode module 200. When solder reaches the metal layer on the side walls of diode module 200, it indicates that a good mount is made. Having solder applied on the side walls of module 200 also helps to strengthen the bonding of module to external circuitry.

Diode module 200 is relatively strong and has a relatively high tear strength. This is due to the fact that epoxy layer 201 has relatively strong adhesion and high toughness. Epoxy also has high corrosion resistance and high chemical resistance. In addition, epoxy layer 201 permits a variety of sizes for diode module 200. Because of the strong adhesive nature of the epoxy material, epoxy layer 201 can be relatively thin and relatively small and still hold chips 202 and 203. Moreover, the use of epoxy results in a fabrication process that is streamlined. In addition, a relatively high yield can be obtained. Epoxy layer 201 can be deposited at room temperature in one step to separate chips 202 and 203 of module 200 and to encase module 200. This allows diode module 200 to be fully packaged on the wafer. One advantage of having packaged devices on the wafer is that they can be easily tested on the wafer and then sawed into individual devices.

Furthermore, air bubbles are avoided in diode module 200 by employing epoxy layer 201. Because the epoxy material is in liquid state at room temperature, the deposition can be performed using centrifugal force at room temperature and air bubbles in epoxy layer 201 are avoided during the deposition.

FIGS. 9-14 illustrate an integrated circuit package 70. As can be seen from FIGS. 9-14, integrated circuit package 70 includes an integrated circuit chip 81, a plurality of connection pads 72a through 75h connected to integrated circuit chip 81, and an epoxy layer 71 embedding integrated circuit 81 and the plurality of connection pads 72a-75h. FIG. 9 is a perspective view of the entire package 70 from the top. FIG. 10 is a bottom-up perspective view of the entire package 70. FIG. 11 is a perspective view of integrated circuit chip 81 and connection pads 72a through 75h without epoxy layer 71. FIG. 12 is a cross-sectional view of a portion of integrated circuit package 70 taken along line 12—12 of FIG. 10. Referring to FIGS. 9-11 connection pads 72a-75h are arranged along four sides of integrated circuit chip 81. Pads 72a-75h provide electrical connection between integrated circuit chip 81 and external circuitry (not shown). Metallic bridges 85a-88h couple connection pads 72a-75h, respectively, to integrated circuit chip 81. Metallic bridges 85a-88h are also referred to as metal interconnecting structures.

Integrated circuit chip 81 also includes a contact metal layer 82 residing on the bottom of integrated circuit chip 81. Metal layer 82 also provides electrical connection of integrated circuit chip 81 to external circuitry. In an alternative embodiment, contact metal layer 82 can be an insulating film layer. In this situation, electrical connections to external circuitry of intergrated circuit chip 81 are only provided by connection pads 72a-75h. Each of pads 72a-75h also includes one of a plurality of contact metal layers 76a-79h, respectively.

Contact metal layers 76a-79h each can extend to the side walls of its respective one of connection pads 72a-75h. This facilitates inspection during surface mount of package 70 to external circuitry. The fact that sufficient solder is applied and a good mount is made can be easily confirmed by seeing the solder on the side walls of connection pads 76a-79h. Having solder applied on the side walls of connection pads 76a-79h also helps to strengthen the bonding of package 70 to external circuitry.

Epoxy layer 71 covers integrated circuit chip 81, metallic bridges 85a-88h and connection pads 72a-75h from the top, leaving contact metal layers 76a-79h and 82 uncovered. Integrated circuit chip 81, metallic bridges 85a-88h, and connection pads 72a-75h are thus encased in epoxy layer 71. Epoxy layer 71 sandwiches each of metallic bridges 85a-88h. Epoxy layer 71 acts to hold integrated circuit chip 81 and connection pads 72a-75h in place. Epoxy layer 71 also forms the outer perimeter of integrated circuit package 70.

Epoxy layer 71 can be replaced with any other insulative layers. For example, epoxy layer 71 can be replaced with a plastic layer.

For one embodiment, epoxy layer 71 comprises a single insulative layer. For another embodiment, epoxy layer 71 comprises a rigid insulative layer and a flexible coating. The rigid insulative layer is only deposited on top of integrated circuit chip 81 before the deposit of the flexible coating in order to increase the rigidity of chip 81, The flexible insulative coating, allows thermal expansion of metal bridges 85a-88h. For an alternative embodiment, epoxy layer 71 comprises a flexible insulative layer and a rigid insulative coating. The rigid insulative coating is deposited on top of the flexible insulative layer.

Integrated circuit package 70 can be die-attached to external circuit using solder or conductive epoxy.

Integrated circuit chip 81 may include one or more transistors, diodes, resistors, and other circuit elements. Integrated circuit chip 81 can, for example, be comprised of complementary metal oxide semiconductor ("CMOS") circuits, bipolar circuits, or gallium arsenide circuits.

Metal layer 82 on the bottom of integrated circuit chip 81, in one embodiment, is made of nickel-arsenic-gold. For another embodiment, metal layers 76a-79h are made of nickel-arsenic-gold.

For one embodiment, metallic bridges 85a-88h are made of titanium. In alternative embodiments, Ni-chrome-nickel and other metals may be used. For another embodiment, metallic bridges 85a-88h are coated with gold.

Referring to FIG. 12, integrated circuit chip 81 of package 70 includes integrated circuit 84. Integrated circuit 84 is coupled to connection pad 72h via metallic bridge 85h. Therefore, integrated circuit 84 is coupled to external circuitry via pad 72h. As can be seen from FIG. 12, pad 72h includes metallic layer 76h. As stated above, metallic layer 76h is made of nickel-arsenic-gold in the preferred embodiment.

Integrated circuit 84 is also coupled to external circuitry via metal layer 82. As stated above, metal layer 82 is made of nickel-arsenic-gold in the preferred embodiment.

Pad 72h is a semiconductor block which includes a connection well 89. Connection well 89 is where metallic bridge 85h connects to pad 72h. Pad 72h in turn provides a straight connection path between metallic bridge 85h and metal layer 76h. Metal layer 76h can then connect to external circuitry. As stated above, metal layer 76h is made of nickel-arsenic-gold.

For another embodiment, metal layer 76h can extend to sidewalls of pad 72h in order to facilitate inspection during surface mount of integrated circuit package 70. The fact that the solder has been sufficiently applied can be confirmed by seeing the solder on the side walls of connection pad 72h. When solder reaches the metal layer on sidewalls of a device, it indicates that a good mount is made. Having metal layer 76h extend to side walls of connection pad 72h also helps to strengthen the bonding of integrated circuit package 70 to external connection board.

Metallic bridge 85*h*. contacts integrated circuit 84 via an opening 88 of an insulating layer 83. Metallic bridge 85*h* extends from integrated circuit chip 81 to connection pad 72*h*.

Epoxy layer 71 separates integrated circuit chip 81 from connection pad 72*h*. Epoxy layer 71 also resides on top of metallic bridge 85*h* and in well 89. As shown in FIG. 12, metallic bridge 85*h* is sandwiched by epoxy layer 71. Epoxy layer 71 is applied in one process step to integrated circuit package 70 on wafer. Epoxy layer 71 holds metallic bridge 85*h* and connection well 89 in place.

Pad 72*h* provides thermal paths through relatively large volume of silicon to external circuitry, thereby providing a relatively high power capability. Pad 72*h* provides relatively large metal land area 76*h* that can be stress relieved. The thermal energy of integrated circuit chip 81 can also be conducted directly from integrated circuit chip 81 to external circuitry via metal layer 82. As described above, metal layer 82 can be an insulating film.

Integrated circuit package 70 is relatively strong and has a relatively high tear strength. This is due to the fact that epoxy layer 71 has relatively strong adhesion, high corrosion, and high toughness.

In addition, the use of an epoxy layer permits a fabrication process that is streamlined and that results in a relatively high yield. Epoxy layer 71 can be deposited at room temperature in one step to separate integrated circuit chip 81 from connection pads 72*a*–72*h* and to encase package 70. This allows integrated circuit package 70 to be fully packaged on the wafer. One advantage of having packaged devices on the wafer is that they can be easily tested on the wafer and then sawed into individual devices.

Moreover, air bubbles are avoided in integrated circuit package 70 by using epoxy layer 71. Because the epoxy material is in liquid state at room temperature, the deposit can be performed using centrifugal force at room temperature and air bubbles in epoxy layer 71 are avoided during the deposition.

FIGS. 13 and 14 illustrate two different integrated circuit packages 90 and 100 that can be packaged in the epoxy material. In FIG. 13, integrated circuit chip 91 of integrated circuit package 90 is connected to its pads via metallic bridges of different lengths. For example, metallic bridge 92 is longer than metallic bridge 93.

In FIG. 14, integrated circuit chip 101 is connected to integrated circuit chip 102 via a plurality of metallic bridges 110 through 110*n*.

FIGS. 15 through 20 illustrate the stages of one fabrication process for ring quad 130 (FIG. 5) that includes Schottky-barrier diodes, according to one preferred embodiment of the present invention. Referring to FIG. 15, the fabrication process starts with a wafer 300 of N+ type silicon substrate. An upper layer 301 comprised of N− type silicon is then formed on top of the substrate by epitaxial growth. Wafer 300 is then subjected to an oxidation process that results in a layer of silicon dioxide being formed on the substrate of wafer 300.

For another embodiment, wafer 300 includes a P+ type silicon substrate. An upper P− type silicon layer is then formed.

In the preferred process, a photolithography process is employed to form an opening 307 in the N− layer 301 and a first well 303 through the N− layer 301 and into wafer 300 of the N+ type silicon. The photolithography process is as follows.

A mask is prepared on a glass plate. The mask determines which areas of silicon dioxide layer on the top of layer 301 and wafer 300 are to be removed. The silicon dioxide layer of layer 301 is then coated with a thin layer of photosensitive material called photoresist. The layer of photoresist is covered by the mask and an ultraviolet light is applied. The mask causes the ultraviolet light to be applied only to certain regions of the photosensitive material. The resulting wafer is subjected to a chemical solution that removes only the portions of the photosensitive material not exposed to the ultraviolet light. A second solution is applied that etches away silicon in areas not covered by the photoresist material. Thus, silicon is etched away in order to form opening 307 and first well 303. The next step is the removal, by solution, of the remaining photosensitive material. The process for forming opening 307 and first well 303 is also referred to as pit etch process.

Referring to FIG. 16, an insulating layer 319 is applied on top of the N− layer 301. The photolithography process is then used to remove insulating layer 301 inside opening 307 and first well 303. Opening 307 thus extends through insulating layer 319 and first well 303 also extends through insulating layer 319.

A contact metal layer 308 is then deposited by metal deposition in a high-vacuum system on top of insulating layer 319. Metal layer 308 extends into opening 307 and contacts the N+ type of silicon of wafer 300 in first well 303. Metal layer 308 fills opening 307 which forms the Schottky-barrier metal of a diode 311. Metal layer 308 also coats the sides of first well 303. In one embodiment, metal layer 308 is made of titanium. In alternative embodiments, Nichrome-nickel and other metals can be used instead of titanium to form layer 308.

A second layer of metal (not shown) of metal is deposited by metal deposition in a high-vacuum system over metal layer 308. In a preferred embodiment, the second layer of metal is gold. The layer of gold helps to inhibit the oxidation of the titanium and aids gold plating. The metal deposition process is described as follows.

A mask is prepared on a glass plate to define the area of metal layer 308 of a metal interconnecting structure. In this case, metal layer 308 is coated with a layer of photoresist. The photoresist layer is covered by the mask, and ultraviolet light is applied. The ultraviolet light exposes those regions of the photoresist not covered by the mask in pattern. The resulting wafer is then subjected to a chemical solution that removes the unexposed photosensitive material. A second solution etches away any metal not covered by the photoresist layer. The areas to the left of boundary 309 and to the right of boundary 310 are thus etched away. As a next step, the photoresist layer on metal layer 308 is removed by a third solution. The result of this masking and etching process is the interconnecting structure 308 that includes a stripline.

Referring to FIG. 17, wafer 300 is then etched between diode 311 and first well 303 to form a second well or depression 321. In the preferred embodiment, second well 321 is deeper than first well 303. As shown in FIG. 17, second well 321 extends through insulating layer 319 and N− layer 301 and well into the N+ silicon substrate 300. Second well 321 is also referred to as channel 321.

Referring to FIG. 18, wafer 300 is then subjected to an epoxy deposition step. An insulative epoxy layer 330 is deposited on the top of wafer 300. Epoxy layer 330, in a preferred embodiment, is deposited using centrifugal force such that no air bubbles can be developed inside epoxy layer 330.

Epoxy layer 330 is applied at room temperature to wafer 300. In alternative embodiments, high temperature insulative epoxy material can be used to form epoxy layer 330.

Epoxy layer 330 covers metal interconnecting structure 308. Epoxy layer 330 is also applied in second well 321. The epoxy material in second well 321 acts as etch stop during an etch step of the process which will be described in more detail below.

As can be seen from FIG. 18, epoxy layer 330 completely covers metal interconnecting structure 308 and diode 311. Therefore, epoxy layer 330 forms a hermetic seal to diode 311 and metal interconnecting structure 308.

Wafer 300 is then sandblasted and etched from the back to remove the silicon back up to line 331. In other words, the depth of silicon indicated by length 332 in FIG. 18 is removed by sandblasting and etching. In an alternative embodiment, wafer 300 of FIG. 18 can be backlapped.

Referring to FIG. 19, wafer 300 with epoxy layer 330 is then subjected to another etching step of the fabrication process. The etching is performed on the back of wafer 300 below second well 321 towards epoxy layer 330. The etching stops at the epoxy material in second well 321. Therefore, the epoxy material in second well 321 acts as etch stop. As can be seen from FIG. 19, wafer 300 is separated by the back etching into a first chip 340 and a second chip 341. First chip 340 includes diode 311 and second chip 341 includes first well 303. Metal interconnecting structure 308 connects diode 311 of first chip 340 to the semiconductor silicon of second chip 341. Metal interconnecting structure 308 extends between first chip 340 and second chip 341. As can be seen from FIG. 19, both first and second chips 340 and 341 are embedded in epoxy layer 330. First chip 340 of wafer 300 has a first bottom 350 and second chip 341 of wafer 300 has a second bottom 351.

Referring to FIG. 20, the first bottom 350 and the second bottom 351 are then applied with metal to create metal land areas 360 and 361, respectively. For one embodiment, Nichrome-gold is evaporated onto bottoms 350 and 351, creating ohmic contacts 360 and 361. The Nichrome-gold evaporation is made in room temperature. Thus a contact metal 360 is formed below diode 311 and a contact metal 361 is formed below first well 303. Contact metal layers 360 and 361 are flat and relatively large, which helps to ensure good contact with external circuitry. As can be seen from FIG. 20, contact layers 360 and 361 extend upwardly onto the side walls of wafer 300 of first and second chips 340 and 341.

Tests can then be made from contact metal layers 360 and 361, respectively. This is done by attaching the top of epoxy layer 330 to a black wax. After testing, wafer 300 is sawed into individual ring quads.

FIGS. 21 through 24 illustrate the fabrication process for ring quad 170 (FIG. 6) that includes PIN diodes, according to another preferred embodiment of the present invention. FIGS. 21–24 illustrate different stages of the fabrication process.

Referring to FIG. 21, the fabrication process starts with a wafer 600 of N+ type silicon. Layer 604 comprised of N− type silicon is then formed by epitaxial growth. Layer 603 comprised of P+ type silicon is then formed by boron diffusion into wafer 600. Wafer 600 is then subjected to an oxidation process that results in a layer of silicon dioxide being formed on the surface of wafer 600.

The layer 604 is also referred to as the intrinsic I region 604. The P+ layer 603, the N− layer 604, and the N+ type of silicon of wafer 600 form a mesa structure 602. A mesa is a plateau of semiconductor material with relatively steep sides. The P+ layer 603, the N− layer 604, and the N+ type wafer 600 form the PIN diode which is also represented by mesa structure 602.

In an alternative process, the fabrication process starts with a wafer of P+ type silicon. In this alternative process, a middle P− layer is formed, and then an upper N+ layer is formed. In this case, a NIP diode is formed by the N+ layer, the P− layer, and the P+ wafer.

A photolithography process is employed to form mesa 602, well or depression 601 in wafer 600 as shown in FIG. 21. The photolithography process is as follows.

A mask is prepared on a glass plate. The mask determines which areas of silicon dioxide layer on the top of wafer 600 are to be removed. The silicon dioxide layer of wafer 600 is coated with a thin layer of photosensitive material called photoresist. The layer of photoresist is covered by the mask and an ultraviolet light is applied. The mask causes the ultraviolet light to be applied only to certain regions of the photosensitive material. The resulting wafer is subjected to a chemical solution that removes only the positions of the photosensitive material not exposed to the ultraviolet light. A second solution is applied that etches away silicon dioxide in areas not covered by the photoresist material. Thus, silicon dioxide is etched away in order to form mesa 602 and well 601. The next step is the removal, by solution, of the remaining photosensitive material. The process for forming mesa 602 and well 601 is also referred to as the pit etch process.

The above described steps are typically used to form mesa 602 which constitutes a PIN diode or a NIP diode. Other steps may be employed to form other integrated circuits on wafer 600.

Referring to FIG. 22, an insulating layer 605 is applied on the top of wafer 600, covering mesa 602 and first well 601. The photolithography process is then performed to make an opening 606 through insulating layer 605 to expose the top of mesa 602. The photolithography process also removes insulating layer 605 inside first well 601.

A first metal layer 612 is then deposited by metal deposition in a high vacuum system on top of insulating layer 605, and into opening 606 and first well 601. First metal layer 612 contacts the P+ region 603 of mesa 602 through opening 606. First metal layer 612 also coats the sides of well 601. Therefore first metal layer 612 contacts the N+ type wafer 600 in first well 601. First metal layer 612 connects the P+ region 603 of mesa 602 to wafer 600 in first well 601. For one embodiment, metal layer 612 is titanium and is referred to as the contact metal. For alternative embodiments, nickel and other metals can be used instead of titanium to form layer 612.

A second layer (not shown) of metal is deposited by metal deposition in a high-vacuum system over first metal layer 612. For one embodiment, the second layer of metal is gold. The layer of gold helps to inhibit the oxidation of the titanium and aids gold plating. The metal deposition process is described as follows.

A mask is prepared on a glass plate to define the area of a metal interconnecting structure. The metal interconnecting structure includes a stripline. The stripline is a thin metal line that couples diode 602 to the silicon in first well 601. Metal layer 612 is coated with a layer of photoresist. The photoresist layer is covered by the mask, and ultraviolet light is applied. The ultraviolet light exposes those regions of the photoresist not covered by the masking pattern. The resulting wafer 600 is then subjected to a chemical solution that removes the unexposed photosensitive material. A second solution etches away any metal not covered by the photoresist layer. The areas to the left of boundary 614 and to the right of boundary 613 are thus etched away. Thus, metal layer 612 ends at boundaries 613 and 614. As a next step, the photoresist layer on metal layer 61 2 is removed by a third solution. The result of this masking and etching process is the interconnecting structure that includes the stripline on wafer 600.

Next, wafer 600 is etched between mesa 602 and first well 601 to form a second well or depression 610. Second well 610 is deeper than first well 601.

Wafer 600 of FIG. 22 is then sandblasted and etched from the back to remove the back silicon up to line 620. In other words, the depth of silicon indicated by length 619 in FIG. 22 is removed by sandblasting and etching. In an alternative embodiment, wafer 600 can be back-lapped. The result of sandblasting and etching (or back-lapping)is shown in FIG. 23.

Referring to FIG. 23, metal land areas are created through photomasking and etching on bottom 620 of wafer 600. For one embodiment, nickel-arsenic-gold is evaporated onto bottom 620 of wafer 600, creating an ohmic contact. The nickel-arsenic-gold evaporation is made in a furnace at high temperature. The nickel-arsenic-gold is then etched away from bottom 620 of wafer 600 residing beneath second well 610. In this way, a contact metal layer 621 is formed on bottom 620 of wafer 600 beneath first well 601 and a contact metal layer 622 is form on bottom 620 of wafer 600 beneath mesa 602. Thus, bottom 620 of wafer 600 beneath mesa 602 is metalized and bottom 620 of wafer 600 beneath first well 601 is also metalized. Contact metal layers 621 and 622 are flat and relatively large, which helps to ensure good contact with external circuitry.

In an alternative embodiment, nickel-arsenic-gold is plated on bottom 620 of wafer 600 to form contact metal layers 621 and 622. In a further alternative embodiment, palladium-silicide, nickel-arsenic, and nickel-gold can be used to form contact metal layers 621 and 622 on bottom 620 of wafer 600. In the embodiment in which palladium-silicide is used, the alloy material is heated by electron beam.

Next, a layer of insulative epoxy material 630 is applied on top of wafer 600 and metal layer 612 that forms the metal interconnecting structure with the stripline. The layer of epoxy material 630 is also applied on top of metal layer 612 in first well 601, and in second well 610. The epoxy material in second well 610 acts as etch stop during an etching step which will be described in more detail below.

For one embodiment, the layer of insulative epoxy material 630 is applied using centrifugal force such that no air bubble can be formed inside layer 630 during the epoxy deposition step.

Epoxy layer 630 is applied at room temperature to wafer 600. In alternative embodiments, high temperature insulative epoxy material can be used to form epoxy layer 630. In this case, the epoxy deposition step can be performed prior to the step of forming contact metal layers 621 and 622 on bottom 620 of wafer 600.

The portion of bottom 620 of wafer 600 which is not metalized is then etched toward second well 610. The etching stops when it reaches epoxy layer 630 in second well 610. The epoxy material in second well 610 acts as etch stop. The result of this etching is shown in FIG. 24.

Referring to FIG. 24, the etching breaks wafer 600 into a first chip 631 and a second chip 632. First chip 631 includes diode 602. Metal layer 612 which forms the metal interconnecting structure connects diode 602 of first chip 631 to semiconductor silicon of second chip 632. Metal layer 612 extends between first chip 631 and second chip 632. As stated above, metal layer 612 is comprised of an ohmic contact metal layer with a very thin layer of gold on top (not shown). The gold layer inhibits the oxidation of the metal layer 612. As can be seen from FIG. 24, both first and second chips 631 and 632 are embedded in epoxy layer 630.

For one embodiment, first chip 631 is a monolithic integrated circuit, which means it is constructed within a single wafer of semiconductor material. Metal layer 612 contacts the P+ layer 603 of diode 602. Metal layer 612 contacts second chip 632 in first well 601. As can be seen from FIG. 24, metal layer 612 resides between epoxy layer 630. Epoxy layer 630 separates first and second chips 631 and 632.

Contact metal layer 622 resides beneath first chip 631 to form a first connection point to external circuitry. Contact metal layer 621 resides beneath second chip 632 to form a second connection point to external circuitry.

Next, another metal deposition process is made to extend metal contact layers 621 and 622 to the side walls of chips 631 and 632 (not shown). The deposition can be made by Nichrome-gold evaporation at room temperature.

Tests can then be made from metal layers 621 and 622 for first and second chips 631 and 632, respectively. This is done by attaching the top of epoxy layer 630 to a black wax. After testing, wafer 600 is sawed into individual ring quads.

FIG. 25 is a cross-sectional side view illustrating a portion of an integrated circuit package 700 being surface mounted on a circuit board 720. As shown in FIG. 25, the portion of integrated circuit package 700 includes a silicon substrate 701 that comprises an integrated circuit 702. Integrated circuit 702 extends through an insulating layer 703 on top of substrate 701 and contacts a metal bridge 706. The bottom of substrate 701 is coated with an insulating film 709. Alternatively, layer 709 on the bottom of substrate 701 is a metal contact layer.

Package portion 700 also includes a connection pad 707. Connection pad 707 is made of the same semiconductor silicon as that of substrate 701. Metal bridge 706 contacts the top of connection pad 707. The bottom of connection pad 707 is coated with a metal contact layer 708. For one embodiment, metal contact layer 708 extends to side walls of connection pad 707 to contact metal bridge 706. For another embodiment, metal contact layer 708 extends to side walls of connection pad 707 but does not contact metal bridge 706. For yet another embodiment, metal contact layer 708 does not extend to side walls of connection pad 707.

Having metal contact layer 708 extend to side walls of connection pad 707 helps to strengthen the bonding between integrated circuit package 700 and printed circuit board 720. This is due to the fact that solder can be placed on metal contact layer 708 on the side walls of connection pad 707, as shown in FIG. 25. It also facilitates inspection during surface mount of package 700 to board 720. Whether a good mount is made can be easily confirmed by seeing the solder on the side walls of connection pad 707.

A first insulative layer 704 resides on top insulating layer 703 of substrate 701. First insulative layer 704 also resides on top of metal bridge 706 that resides on top of integrated circuit 702 and insulating layer 703 of substrate 701. A second insulative coating 705 then resides on top of first insulative layer 704 and on top of metal bridge 706. Second insulative coating 705 also resides between substrate 701 and connection pad 707. Second insulative coating 705 separates substrate 701 from connection pad 707. Metal bridge 706 is sandwiched by second insulative coating 705.

For one embodiment, first insulative layer 704 is a rigid plastic layer and second insulative coating 705 is a flexible plastic layer. For another embodiment, first insulative layer 704 is a rigid plastic layer and second insulative coating 705 is epoxy layer.

For alternative embodiments, either a flexible insulative coating layer or a rigid insulative coating layer can be used exclusively. For a further alternative embodiment, first insulative layer 704 is a flexible insulative layer and second insulative coating 705 is a rigid insulative coating which is deposited after the flexible insulative layer.

Returning to FIG. 25, the advantage of having flexible insulative coating 705 on both sides of metal bridge 706 and rigid insulative layer 704 on top of substrate 701 is that rigid insulative layer 704 increases the rigidity with respect to the integrated circuit underneath coating 705 while flexible insulative coating 705 permits thermal expansion of metal bridge 706. When the temperature of metal bridge 706 rises, metal bridge 706 tends to expand. This may cause problems if metal bridge 706 is not allowed to expand. For example, the solder joint could be weakened. In addition, it is possible that in certain cases the metal bridge could be weakened or could break if expansion is not permitted. Having flexible insulative coating 705 on both sides of metal bridge 706 permits thermal expansion in view of the flexibility of coating 705.

Package portion 700 can then be surface mounted on printed circuit board 720. By doing so, solder 710 is applied between metal contact layer 708 of connection pad 707 and on circuit board conductor 721. When metal contact layer 708 extends to side walls of connection pad 707, solder 710 may also be applied to the side walls of connection pad 707. This facilitates inspection during surface mount of package 700 to circuit board 720. The fact that solder has been applied can be confirmed by seeing the solder at the side walls of connection pad 707. When solder 710 reaches metal contact layer 708 on the side walls of connection pad 707, it indicates that a good mount is made. Having solder on the side walls of connection pad 707 also helps to strengthen the bond between integrated circuit 700 the printed circuit board 720.

FIGS. 26 through 30 illustrate the fabrication process for integrated circuit package 700 of FIG. 25, according to another preferred embodiment of the present invention. FIG. 26–30 illustrate different stages of the fabrication process.

Referring to FIG. 26, the fabrication process starts with a wafer 800. For one embodiment, wafer 800 is comprised of N+ type of silicon. For another embodiment, wafer 800 is comprised of P+ type of silicon.

An integrated circuit 801 is formed in wafer 800 and an insulating layer 802 is deposited on a portion of the top of wafer 800, as shown in FIG. 8. Integrated circuit 801 runs through insulating layer 802 and into wafer 800.

For one embodiment, integrated circuit 801 can be a contact metal connected with other integrated circuits on wafer 800.

A metal layer 803 is then deposited by metal deposition on top of wafer 800, on top of integrated circuit 801, and on top of a portion of insulating layer 802. Metal layer 803 contacts wafer 800 and integrated circuit 801 between insulating layer 802. Metal layer 803 stops at boundary 821 and does not cover the top portion 820 of insulation layer 802. Metal layer 803 is referred to as metal bridge 803 between integrated circuit 801 and wafer 800.

For one embodiment, metal bridge 803 is made of titanium. For another embodiment, metal bridge 803 is made of nickel. For alternative embodiments, other metals can be used to make metal bridge 803.

Referring to FIG. 27, an insulative layer 804 is then deposited on top of metal bridge 803 and on top portion 820 of insulating layer 802. For one embodiment, insulative layer 804 is a rigid plastic layer.

Referring to FIG. 28, wafer 800 is then subjected to an etching step to remove insulative layer 804 on top of part of metal bridge 803. The result of the etch step is that the area of insulative layer 804 to the left of boundary 822 is etched away. Insulative layer 804, however, still resides on the top of metal bridge 803 on top of integrated circuit 801.

Next, wafer 800 is etched to the left of integrated circuit 801 to form a well or depression 805. Well 805 is deeper than integrated circuit 801 in wafer 800. One edge of well 805 corresponds to boundary 822 of insulative layer 804, as shown in FIG. 28.

Referring to FIG. 29, wafer 800 is then deposited with a insulative coating 806. Insulative coating 806 is applied on top of metal bridge 803, on top of insulative layer 804, and into well 805. As shown in FIG. 29, metal bridge 803 is sandwiched by insulative coating 806. The insulative coating material in well 805 acts as etch stop during an etching step which will be described below.

For one embodiment, insulative coating 806 is an epoxy layer. For another embodiment, insulative coating 806 is a flexible plastic coating.

When insulative coating 806 comprises epoxy material, the epoxy layer 806 is applied using centrifugal force such that no air bubbles are formed inside layer 806 during the epoxy deposition step.

Next, wafer 800 is then sandblasted and etched from bottom 807 to remove the back silicon up to line 809. In other words, the depth of silicon indicated by length 808 in FIG. 29 is removed by sandblasting and etching. In an alternative embodiment, wafer 800 can be back-lapped.

Referring to FIG. 30, wafer 800 goes through another sandblasting and etching step. The etching is performed on the back of wafer 800 below well 805 towards second insulative layer 806. The etching stops at layer 806 in well 805. Therefore, the insulative coating material in well 805 acts as etch stop. As shown in FIG. 30, wafer 800 is separated by the back etching into a first portion 813 and a second portion 814 that includes integrated circuit 801. Metal bridge 803 connects integrated circuit 801 of second portion 814 to semiconductor silicon of first portion 813. Second insulating coating layer 806 in well 805 separates first portion 813 from second portion 814.

As can be seen from FIG. 30, the bottom of first portion 813 is coated with a contact metal layer 810. For one embodiment, contact metal layer 810 is formed only on the bottom of first portion 813. For another embodiment, contact metal layer 810 extends over side walls of first portion 813. For yet another embodiment, contact metal layer 810 extends to the side Walls to contact metal bridge 803, as shown in FIG. 30.

The bottom of second portion 814 is coated with an insulating film 811. Alternatively, layer 811 on the bottom of second portion 814 is a metal contact layer.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of fabricating an electrical apparatus, comprising the steps of:

forming a first layer of a first type of semiconductor material on a substrate of a wafer of a second type of semiconductor material;

forming a first opening in the first layer, wherein the first opening does not run through the first layer;

forming a diode in the first opening, wherein the diode has a top;

forming a first well through the first layer and in the substrate, wherein the first well has a bottom;

covering the diode, the first well, and the layer of the first type of semiconductor material with a first insulating layer;

forming a second opening through the first insulating layer to the top of the diode;

removing the first insulating layer above the first well to expose the bottom of the first well;

forming a metallic interconnecting structure that electrically couples the bottom of the first well to the top of the diode over a portion of the first insulating layer between the diode and the first well;

removing the first insulating layer between the diode and the first well to expose a portion of the first layer;

forming a second well in the substrate through the exposed portion of the first layer between the diode and the first well, wherein the second well resides below the metallic interconnecting structure, wherein the second well is deeper than the first well;

covering the metallic interconnecting structure, the first insulating layer, and the first and second wells with a second insulating layer, wherein both the first and second wells are filled with the second insulating layer, wherein the metallic interconnecting structure is sandwiched by the second insulating layer;

removing the second type of semiconductor material residing below a bottom of the second well in order to form a first discrete region of the first type and the second type of semiconductor materials that includes the first well and a second discrete region of the first type and the second type semiconductor materials that includes the diode; and applying a metal layer to a bottom of the first discrete region and a bottom of the second discrete region.

2. The method of fabricating the electrical apparatus of claim 1, wherein the first type of semiconductor material is N− type semiconductor material, the second type of semiconductor material is N+ type semiconductor material.

3. The method of fabricating the electrical apparatus of claim 1, wherein the diode is a Schottky-barrier diode, wherein the Schottky-barrier diode includes a Schottky-barrier metal of titanium that contacts the first layer.

4. The method of fabricating the electrical apparatus of claim 1, wherein the applying step further comprising the step of applying the metal layer to a portion of side surfaces of the first and second discrete regions.

5. The method of fabricating the electrical apparatus of claim 4, wherein the applying step comprises the step of depositing a nonalloy metal by evaporation at a room temperature onto the bottoms of the first and second discrete regions and the portion of side surfaces of the first and second discrete regions.

6. The method of fabricating the electrical apparatus of claim 5, wherein the nonalloy metal is Nichrome-gold.

7. The method of fabricating the electrical apparatus of claim 1, wherein the second insulating layer is applied by centrifugal force.

8. The method of fabricating the electrical apparatus of claim 1, wherein the second insulating layer is an epoxy layer.

9. The method of fabricating the electrical apparatus of claim 1, wherein the second insulating layer is a plastic layer.

* * * * *